United States Patent
Tokutomi et al.

(10) Patent No.: US 10,956,264 B2
(45) Date of Patent: *Mar. 23, 2021

(54) MEMORY SYSTEM

(71) Applicant: Toshiba Memory Corporation, Minato-ku (JP)

(72) Inventors: Tsukasa Tokutomi, Kamakura (JP); Masanobu Shirakawa, Chigasaki (JP); Marie Takada, Yokohama (JP); Masamichi Fujiwara, Kawasaki (JP); Kazumasa Yamamoto, Kawasaki (JP); Naoaki Kokubun, Kawasaki (JP); Tatsuro Hitomi, Yokohama (JP); Hironori Uchikawa, Fujisawa (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/546,488

(22) Filed: Aug. 21, 2019

(65) Prior Publication Data

US 2019/0377636 A1 Dec. 12, 2019

Related U.S. Application Data

(63) Continuation of application No. 15/916,516, filed on Mar. 9, 2018, now Pat. No. 10,430,275.

(30) Foreign Application Priority Data

Sep. 19, 2017 (JP) .............................. JP2017-179359

(51) Int. Cl.
*G11C 29/00* (2006.01)
*G06F 11/10* (2006.01)
(Continued)

(52) U.S. Cl.
CPC ...... *G06F 11/1068* (2013.01); *G06F 11/1012* (2013.01); *G06F 11/1048* (2013.01);
(Continued)

(58) Field of Classification Search
CPC ............... G06F 11/068; G06F 11/1012; G06F 11/1048; H03M 13/1105; H03M 13/1108;
(Continued)

(56) References Cited

U.S. PATENT DOCUMENTS 9,209,835 B2   12/2015   Alhussien et al.
9,252,817 B2    2/2016   Pan et al.
(Continued)

FOREIGN PATENT DOCUMENTS

JP    2010-165426    7/2010
JP    2012-244305    12/2012
JP    2013-080450    5/2013

*Primary Examiner* — Christine T. Tu
(74) *Attorney, Agent, or Firm* — Oblon, McClelland, Maier & Neustadt, L.L.P.

(57) ABSTRACT

In general, according to an embodiment, a memory system includes a memory device including a memory cell; and a controller. The controller is configured to: receive first data from the memory cell in a first data reading; receive second data from the memory cell in a second data reading that is different from the first data reading; convert a first value that is based on the first data and the second data, to a second value in accordance with a first relationship; and convert the first value to a third value in accordance with a second relationship that is different from the first relationship.

20 Claims, 32 Drawing Sheets

(51) Int. Cl.
  *H03M 13/00*  (2006.01)
  *H03M 13/11*  (2006.01)
  *H03M 13/37*  (2006.01)
  *H03M 13/29*  (2006.01)
  *H03M 13/15*  (2006.01)

(52) U.S. Cl.
  CPC .... *H03M 13/1105* (2013.01); *H03M 13/1108* (2013.01); *H03M 13/1111* (2013.01); *H03M 13/152* (2013.01); *H03M 13/2906* (2013.01); *H03M 13/3715* (2013.01); *H03M 13/6505* (2013.01)

(58) Field of Classification Search
  CPC ............ H03M 13/1111; H03M 13/152; H03M 13/2906; H03M 13/3715; H03M 13/6505
  USPC ................ 714/773, 774, 718, 745, 763, 780
  See application file for complete search history.

(56) References Cited

U.S. PATENT DOCUMENTS

| | | |
|---|---|---|
| 9,563,502 B1 | 2/2017 | Alhussien |
| 2012/0297273 A1 | 11/2012 | Sakaue et al. |
| 2013/0077400 A1 | 3/2013 | Sakurada |
| 2016/0124808 A1* | 5/2016 | Zhang ................. G06F 11/1048 714/764 |
| 2016/0259683 A1 | 9/2016 | Sakurada |
| 2017/0236592 A1 | 8/2017 | Alhussien |
| 2018/0004596 A1* | 1/2018 | Zhang ................. G06F 11/1048 |
| 2019/0007063 A1* | 1/2019 | Lien ................... G06F 11/1076 |
| 2019/0114227 A1 | 4/2019 | Lin |

* cited by examiner

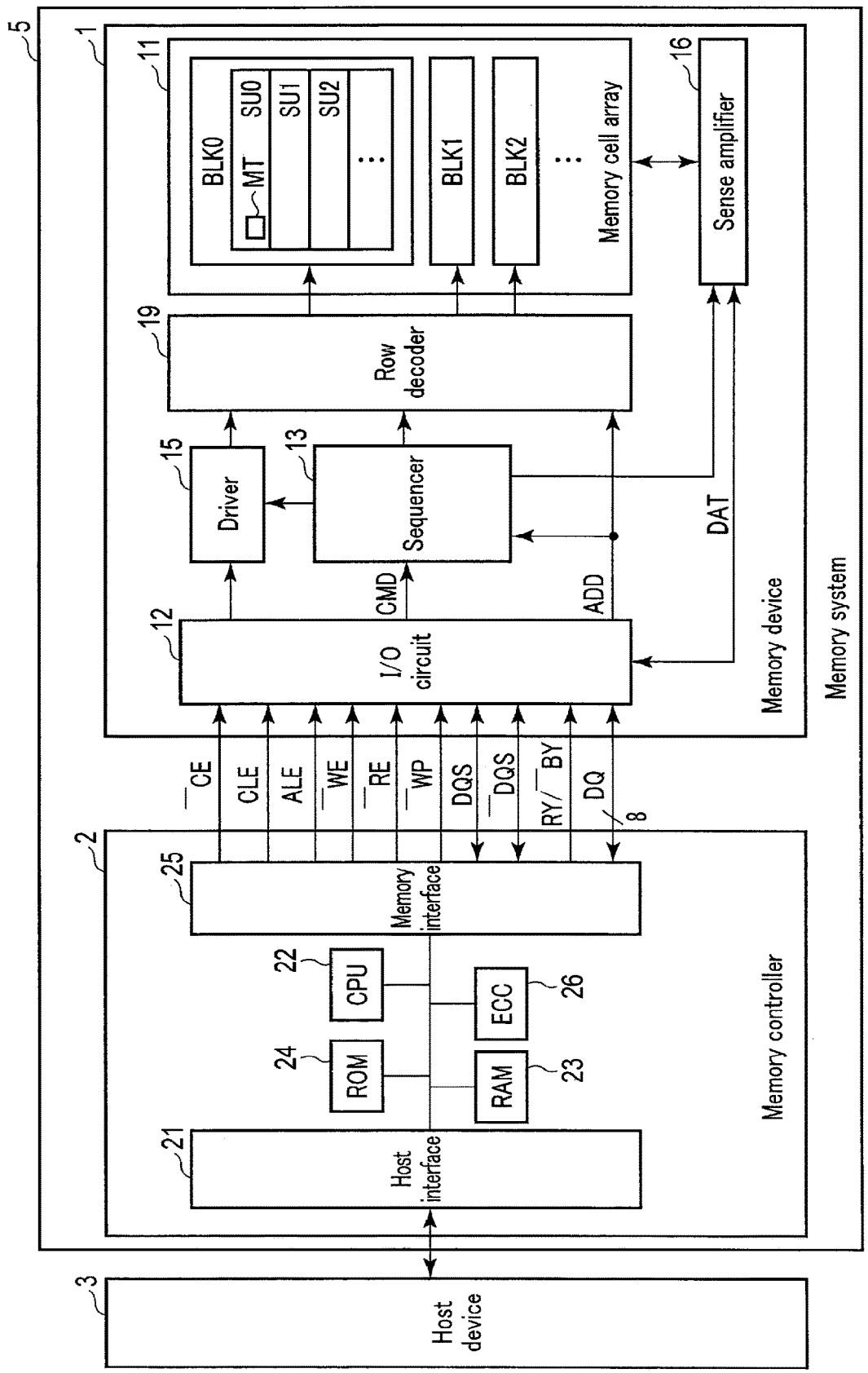
F I G. 1

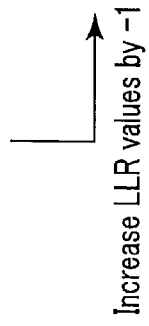
F I G. 10

FIG. 11

LLR table:

| LLR label | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| LLR value | -9 | -5 | -3 | -1 | 1 | 3 | 5 | 8 | 9 | 9 | 8 | 5 | 3 | 1 | -1 | -3 | -5 | -8 | -9 | -9 |

Shift to right by 1:

| LLR label | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| LLR value | -9 | -9 | -5 | -3 | -1 | 1 | 3 | 5 | 8 | 9 | 9 | 8 | 5 | 3 | 1 | -1 | -3 | -5 | -8 | -9 |

Shift to left by 1:

| LLR label | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| LLR value | -5 | -3 | -1 | 1 | 3 | 5 | 8 | 9 | 9 | 8 | 5 | 3 | 1 | -1 | -3 | -5 | -8 | -9 | -9 | -9 |

| Word line | Shift amount $\Delta V$ |
|---|---|
| WL0 | 0 |
| WL1 | 3DAC |
| WL2 | 3DAC |
| ⋮ | ⋮ |
| WL7 | 6DAC |

F I G. 25

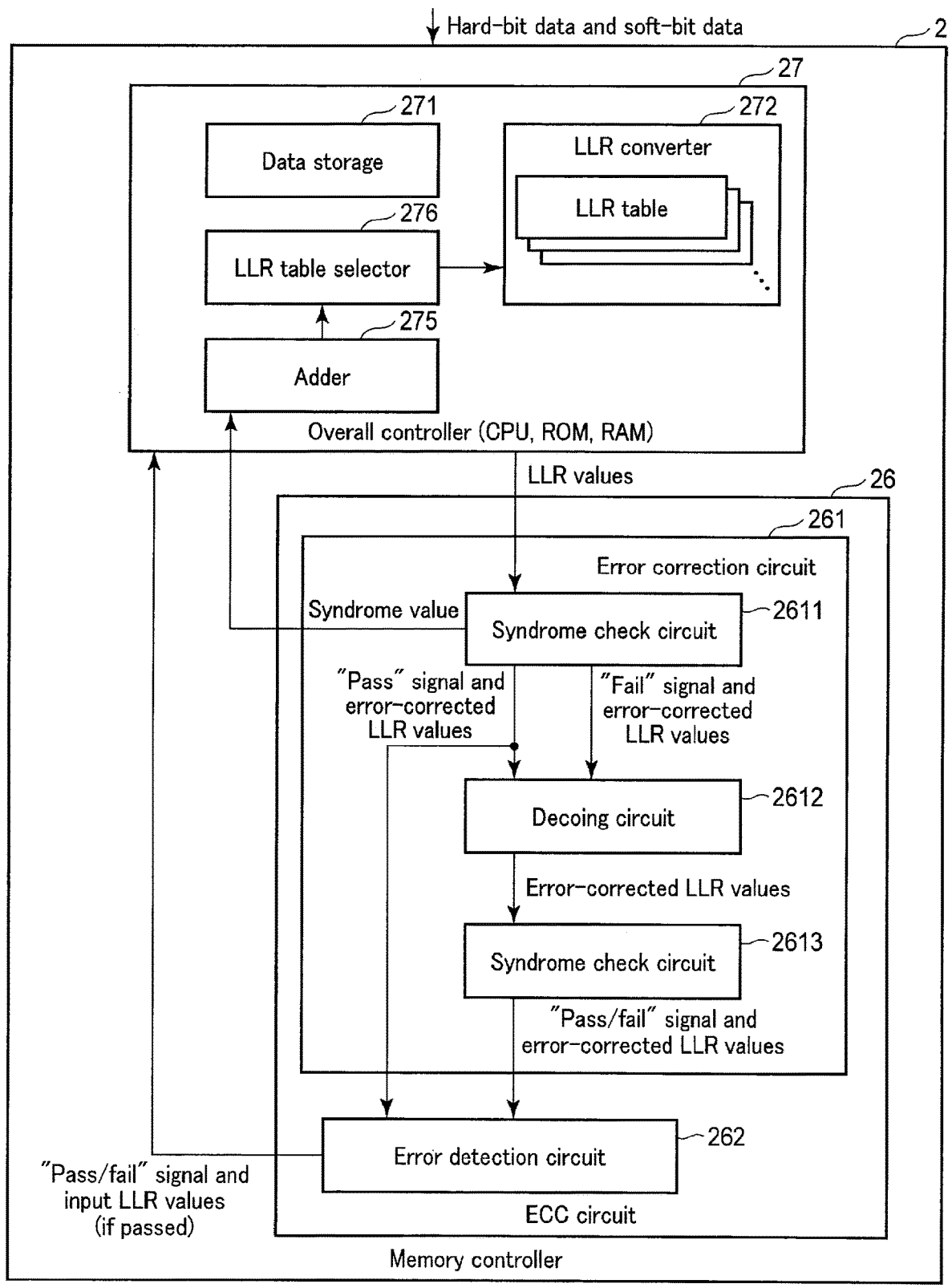
F I G. 26

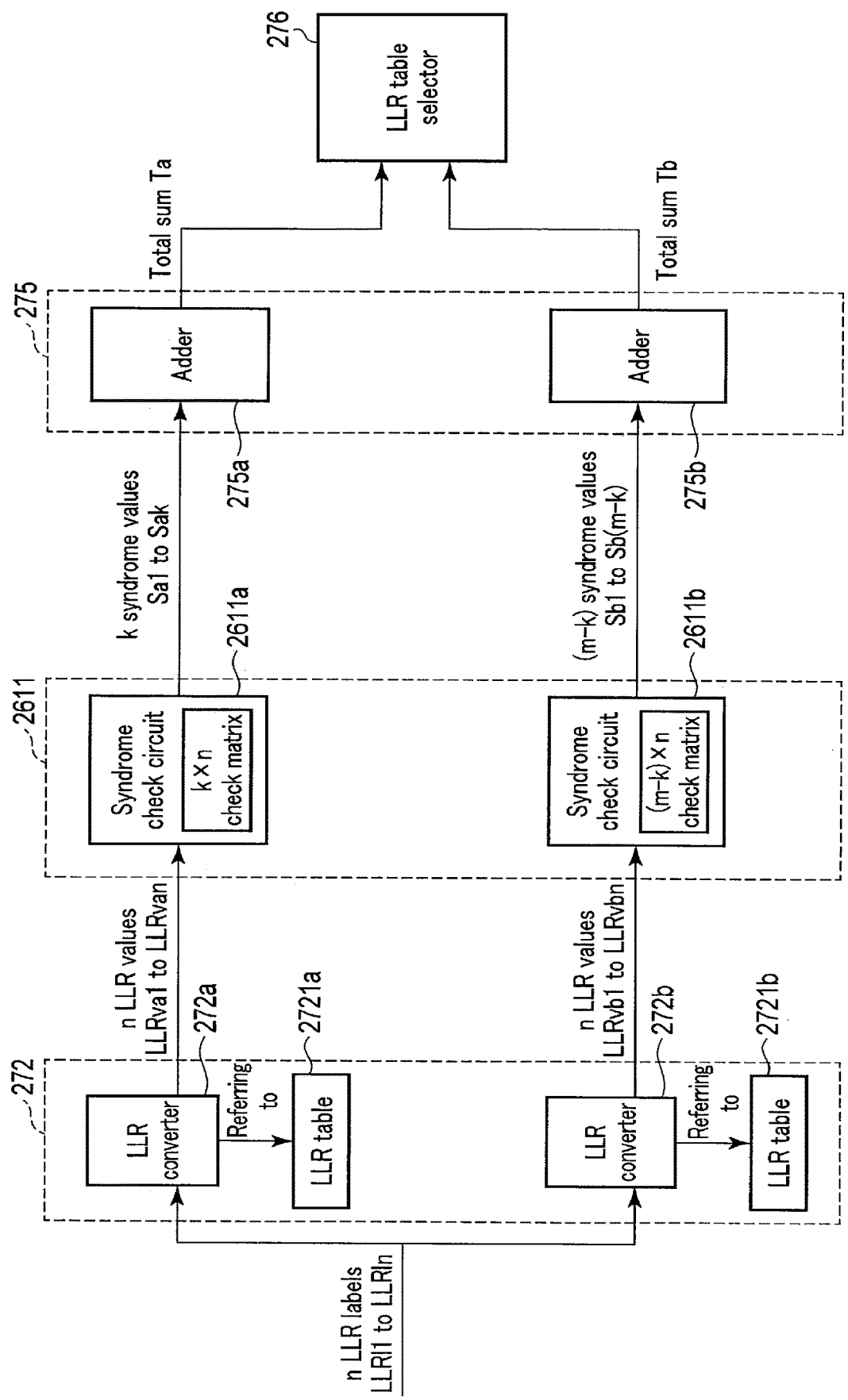
F I G. 27

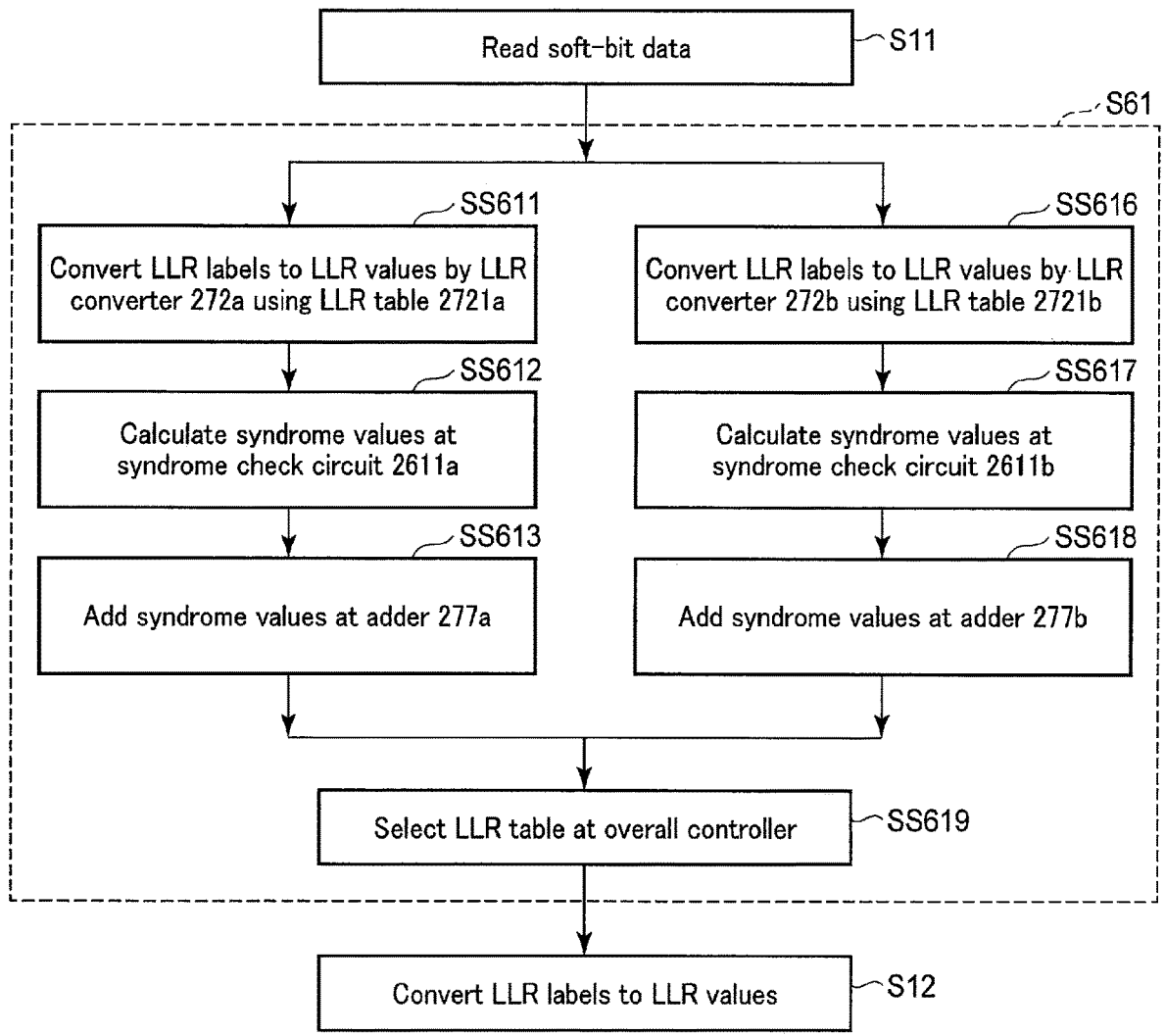
F I G. 29

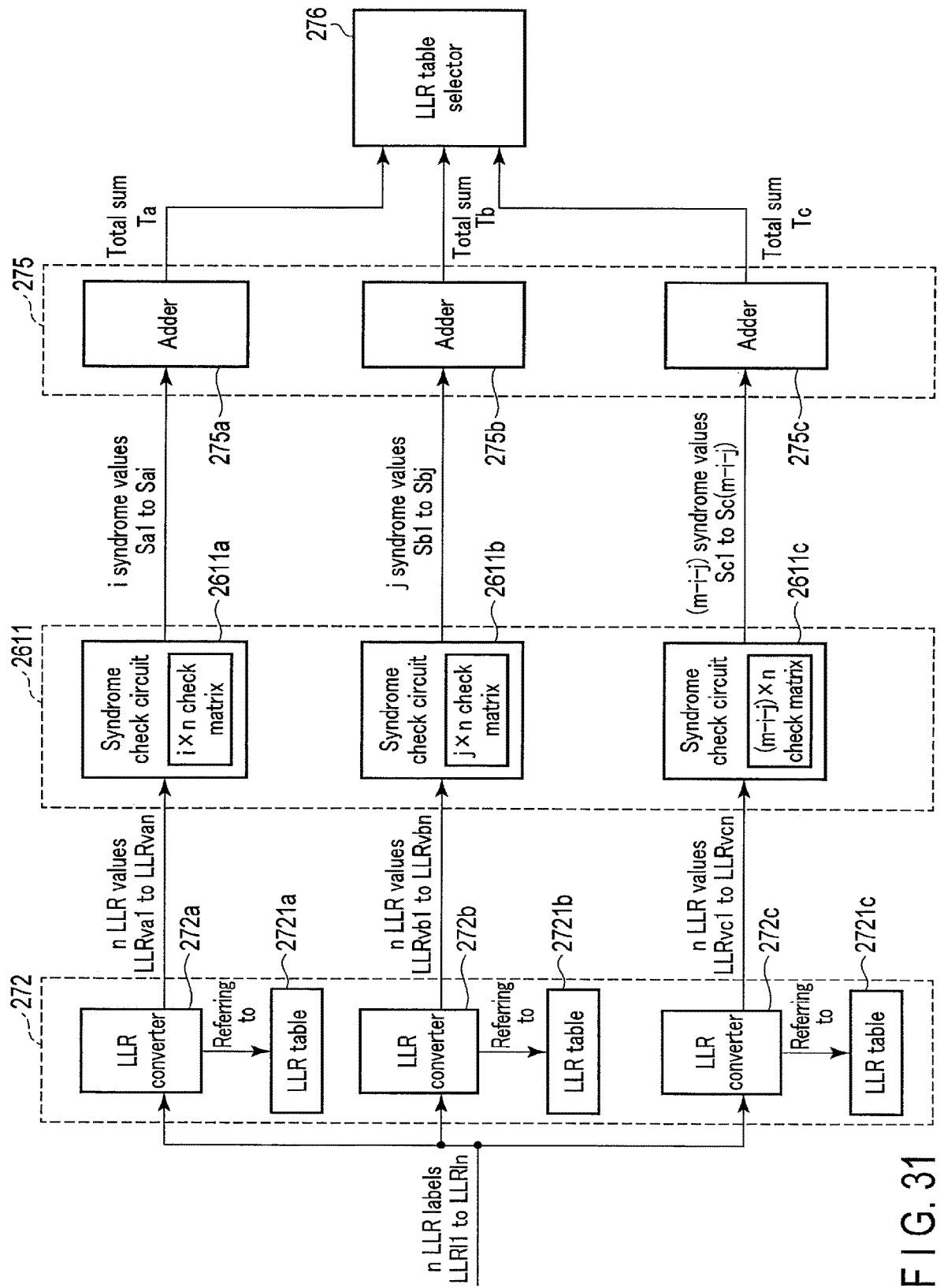
F I G. 31

FIG. 33

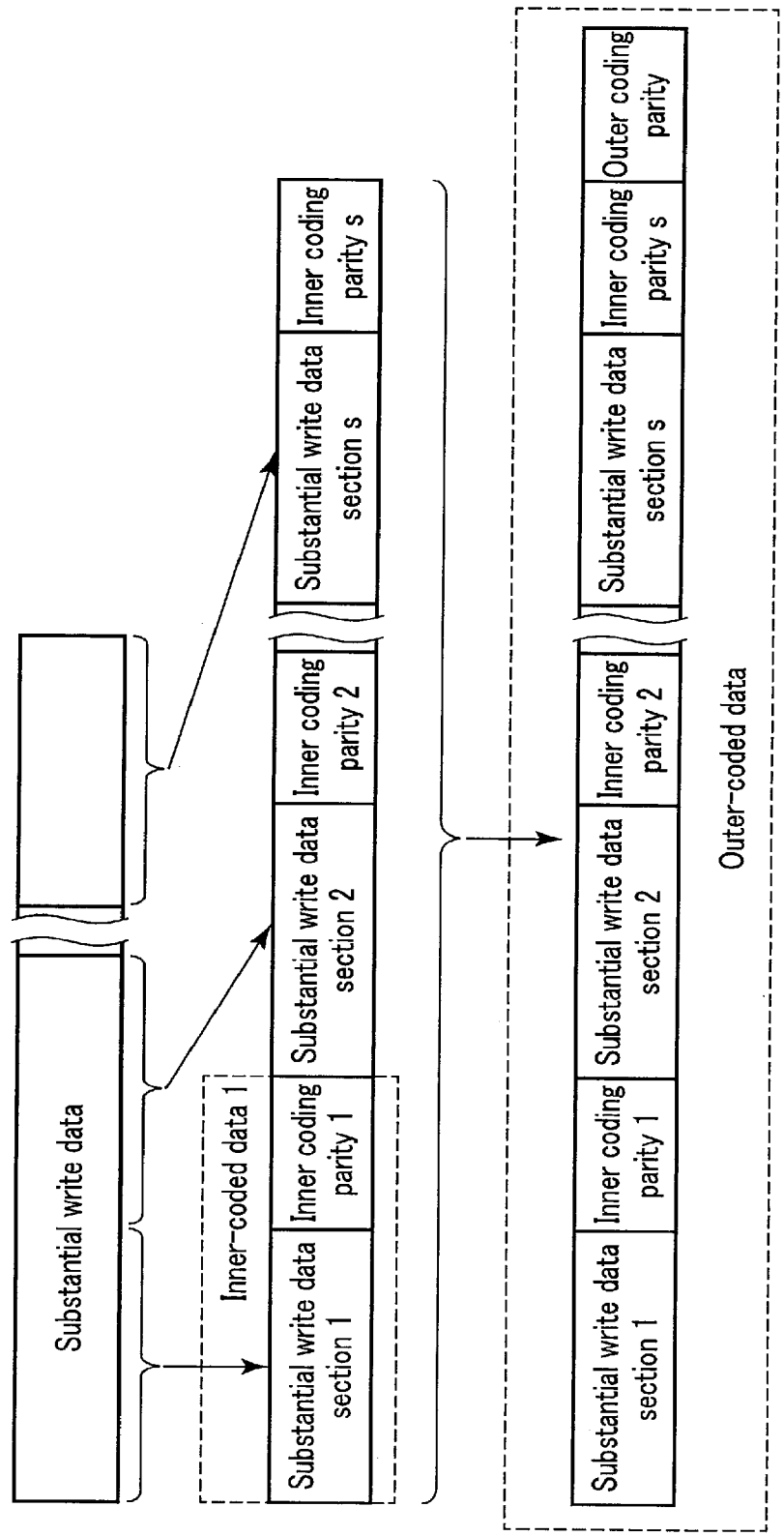
F I G. 36

MEMORY SYSTEM

CROSS-REFERENCE TO RELATED APPLICATIONS

This application is a continuation of and claims the benefit of priority under 35 U.S.C. § 120 from U.S. application Ser. No. 15/916,516 filed Mar. 9, 2018, and claims the benefit of priority under 35 U.S.C. § 119 from Japanese Patent Application No. 2017-179359 filed Sep. 19, 2017, the entire contents of each of which are incorporated herein by reference.

FIELD

Embodiments described herein relate generally to a memory system.

BACKGROUND

A memory system, which includes a memory device and a memory controller configured to control the memory device, has been known.

BRIEF DESCRIPTION OF THE DRAWINGS

FIG. 1 shows components and connections of a memory system, and its related components according to a first embodiment.

FIG. 10 shows examples of changes in an LLR table according to the first embodiment.

FIG. 11 shows other examples of changes in the LLR table according to the first embodiment.

FIG. 25 is a shift table according to the third embodiment.

FIG. 26 is a functional block diagram showing components and connections of an ECC circuit according to the fourth embodiment, and components of a memory controller that are related to the ECC circuit.

FIG. 27 is a detailed block diagram showing a syndrome check circuit and part of an overall controller according to the fourth embodiment.

FIG. 29 shows a sub-flow of part of the operation of the memory system according to the fourth embodiment.

FIG. 31 is a detailed block diagram showing a syndrome check circuit and part of an overall controller according to a fifth embodiment.

FIG. 33 shows an example of a decode check matrix and submatrices according to the fifth embodiment.

FIG. 36 shows examples of the substantial write data and concatenated codes according to the sixth embodiment.

DETAILED DESCRIPTION

Figure 2:
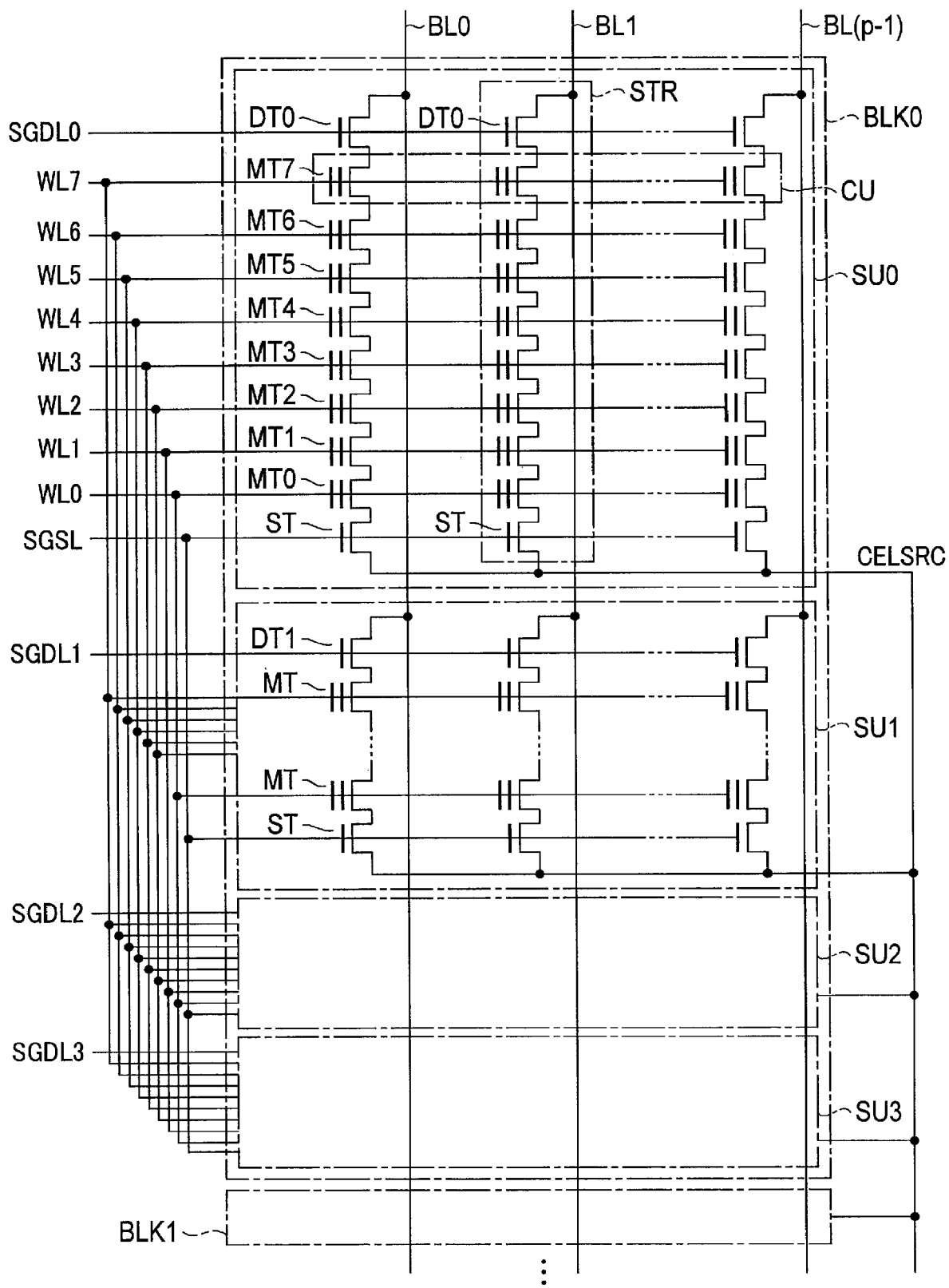
FIG. 2 shows components and connections of a block and its related components according to the first embodiment.

In general, according to an embodiment, a memory system includes a memory device including a memory cell; and a controller. The controller is configured to: receive first data from the memory cell in a first data reading; receive second data from the memory cell in a second data reading that is different from the first data reading; convert a first value that is based on the first data and the second data, to a second value in accordance with a first relationship; and convert the first value to a third value in accordance with a second relationship that is different from the first relationship.

Embodiments will now be described with reference to the figures. In the following description, components with substantially the same functionalities and configurations will be referred to with the same reference numerals, and repeated descriptions may be omitted. Moreover, the entire description for a particular embodiment also applies to another embodiment unless it is explicitly mentioned otherwise or obviously eliminated.

Each functional block can be implemented as hardware, computer software, or a combination of both. For this reason, in order to clearly illustrate that each block can be hardware, software or any combination thereof, descriptions will be made in terms of their functionalities in general. It is not necessary that functional blocks are distinguished as in the following examples. For example, some of the functions may be implemented by functional blocks different from those illustrated below.

Moreover, any step in a flow of a method of an embodiment is not limited to any illustrated order, and can occur in an order different from an illustrated order and/or can occur concurrently with another step.

In the specification and the claims, a phrase of a particular first component being "coupled" to another second component includes the first component being coupled to the second component either directly, or via one or more components which are always or selectively conductive.

Embodiment 1

1. Structure (Configuration)

FIG. 1 illustrates components and connections of a memory device as well as the related components according to the first embodiment. As illustrated in FIG. 1, a memory system 5 is controlled by a host device 3, and it includes a (semiconductor) memory device 1 and a memory controller 2. The memory controller 2 receives commands from the host device 3, and controls the memory device 1 based on the received commands.

1.1. Memory Controller

The memory controller 2 includes a host interface 21, a central processing unit (CPU) 22, a random access memory (RAM) 23, a read only memory (ROM) 24, a memory interface 25, and an error correction code (ECC) circuit 26. The memory controller 2 implements various operations and some of the functions of the host interface 21 and the memory interface 25 when the firmware (program) stored in the ROM 24 and loaded onto the RAM 23 is executed by the CPU 22. The RAM 23 further temporarily stores data, and serves as a buffer and a cache.

The host interface 21 is coupled to the host device 3 via a bus, and manages communications between the memory controller 2 and the host device 3. The memory interface 25 is coupled to the memory device 1, and manages communications between the memory controller 2 and the memory device 1.

The ECC circuit 26 executes processing that is necessary for error detection and correction with respect to the data written into the memory device 1 and data read from the memory device 1. Specifically, the ECC circuit 26 generates redundant data (parities) to correct errors in the data (substantial write data) to be written into the memory device 1. The generated redundant data and substantial write data are written into the memory device 1. When being read from the memory device 1, the data includes the substantial write data and its corresponding redundant data.

Furthermore, the ECC circuit 26 detects errors in the data read from the memory device 1 and, if there is any error, the ECC circuit 26 tries to correct the error. The ECC circuit 26 may perform error correction based on a hard decision such as BCH coding and Reed-Solomon coding, and error correction based on a soft decision such as low-density parity check (LDPC). The ECC circuit 26 will be discussed later.

1.2. Memory Device

The memory device 1 includes a (memory) cell array 11, an input and output circuit 12, a sequencer (controller) 13, a driver 15, a sense amplifier 16, and a row decoder 19.

The cell array 11 includes plural memory blocks (blocks) BLKs (BLK0, BLK1, . . . ). A block BLK is a unit for erasing data, and therefore the data in a block BLK can be erased altogether. Data may also be erased in a unit smaller than one block BLK, such as half a block BLK.

Each block BLK is a set of plural string units SU (SU0, SU1, . . . ). Each string unit SU is a set of plural NAND strings (strings) STR (STR0, STR1, . . . ), which are not shown. A string STR includes plural memory cell transistors (cell transistors) MT.

The input and output circuit 12 is coupled to the memory controller 2 via a NAND bus. The NAND bus transmits signals ⁻CE, CLE, ALE, ⁻WE, ⁻RE, and ⁻WP, signals DQ having an 8-bit width, and data strobe signals DQS and ⁻DQS. Throughout the specification, the sign "⁻" preceding the name of a signal indicates the inversion logic of the signal having that name without the sign "⁻". When the signal with "⁻" is at a low level, the signal is asserted.

The input and output circuit 12 receives the signals DQ, and transmits the signals DQ. The input and output circuit 12 further receives and transmits the data strobe signals DQS and ⁻DQS. The input and output circuit 12 receives various control signals from the memory controller 2, and fetches and outputs the signals DQ based on these control signals. The control signals include the signals ⁻CE, CLE, ALE, ⁻WE, ⁻RE, and ⁻WP, and the data strobe signals DQS and ⁻DQS.

The signals DQ include commands (CMD), write or read data (DAT), address signals (ADD), status data (STA), and the like.

An asserted signal ⁻CE enables the memory device 1. An asserted signal CLE notifies the memory device 1 that the signal DQ that is input into the memory device 1 in parallel to this signal CLE is a command CMD. An asserted signal ALE notifies the memory device 1 that the signals DQ input into the memory device 1 in parallel to this signal ALE is an address signal ADD. An asserted signal ⁻WE instructs the memory device 1 to fetch the signals DQ that are input into the memory device 1 in parallel to the signal ⁻WE. An asserted signal ⁻RE instructs the memory device 1 to output the signals DQ. An asserted signal ⁻WP instructs the memory device 1 to prohibit data writing and erasing. The signal RY/⁻BY indicates whether the memory device 1 is in a ready state or in a busy state, indicating the busy state when being at the low level. In the ready state, the memory device 1 accepts commands from the memory controller 2, while in the busy state it does not accept any commands from the memory controller 2.

The signals DQS and ⁻DQS from the memory controller 2 to the memory device 1 notify the memory device 1 of the timing of outputting the signal DQ. The signals DQS and ⁻DQS from the memory device 1 to the memory controller 2 notify the memory controller 2 of the timing of outputting the signals DQ.

The sequencer 13 receives the commands CMD and address signals ADD from the input and output circuit 12, and controls the driver 15, the sense amplifier 16, and the row decoder 19 based on the commands CMD and address signals ADD.

The driver 15 supplies selected ones of plural potentials to the row decoder 19. The row decoder 19 receives various potentials from the driver 15, receives address signals ADD from the input and output circuit 12, selects one block BLK based on a received address signal ADD, and transfers the potentials from the driver 15 to the selected block BLK.

The sense amplifier 16 senses the state of the cell transistors MT, generates read data based on the sensed state, and transfers the write data to the cell transistors MT.

1.3. Cell Array

FIG. 2 shows an example of some components and connections of the cell array 11 according to the first embodiment, illustrating the components and connections of a block BLK0 and associated components. The plurality of (or all of) blocks BLK each include the components and connections as illustrated in FIG. 2.

A block BLK includes plural (e.g., four) string units SU0 to SU3. Alternatively, one block BLK may include only one string unit SU.

Each of p (where p is a natural number) bit lines BL0 to BLp−1 is coupled to strings STR respectively from the string units SU0 to SU3 in each block BLK.

Each string STR includes one select gate transistor ST, plural (e.g., eight) memory cell transistors MT (MT0 to MT7), and one select gate transistor DT (DT0, DT1, DT2, or DT3). The transistors ST, MT, and DT are coupled in series in this order between a source line CELSRC and one bit line BL. A cell transistor MT includes a control gate electrode (word line WL) and a charge trap layer insulated from the environment, and is configured to store data in a non-volatile manner based on the amount of electric charge in the charge trap layer.

Strings STR that are respectively coupled to different bit lines BL form one string unit SU. In each string unit SU, the control gate electrodes (gates) of the cell transistors MT0 to MT7 are coupled to the word lines WL0 to WL7, respectively. Furthermore, in each block BLK, word lines WL of the same address in different string units SU are also coupled to each other. A set of cell transistors MT that share a word line WL in one string unit SU is referred to as a cell unit CU.

The transistors DT0 to DT3 belong to the string units SU0 to SU3, respectively. In each case of α=0, 1, 2, and 3, the gate of each transistor DTα in the strings STR of a string unit SUα is coupled to a select gate line SGDLα. The gates of the transistors ST are coupled to a select gate line SGSL.

1.4. Cell Transistors

Figure 3:
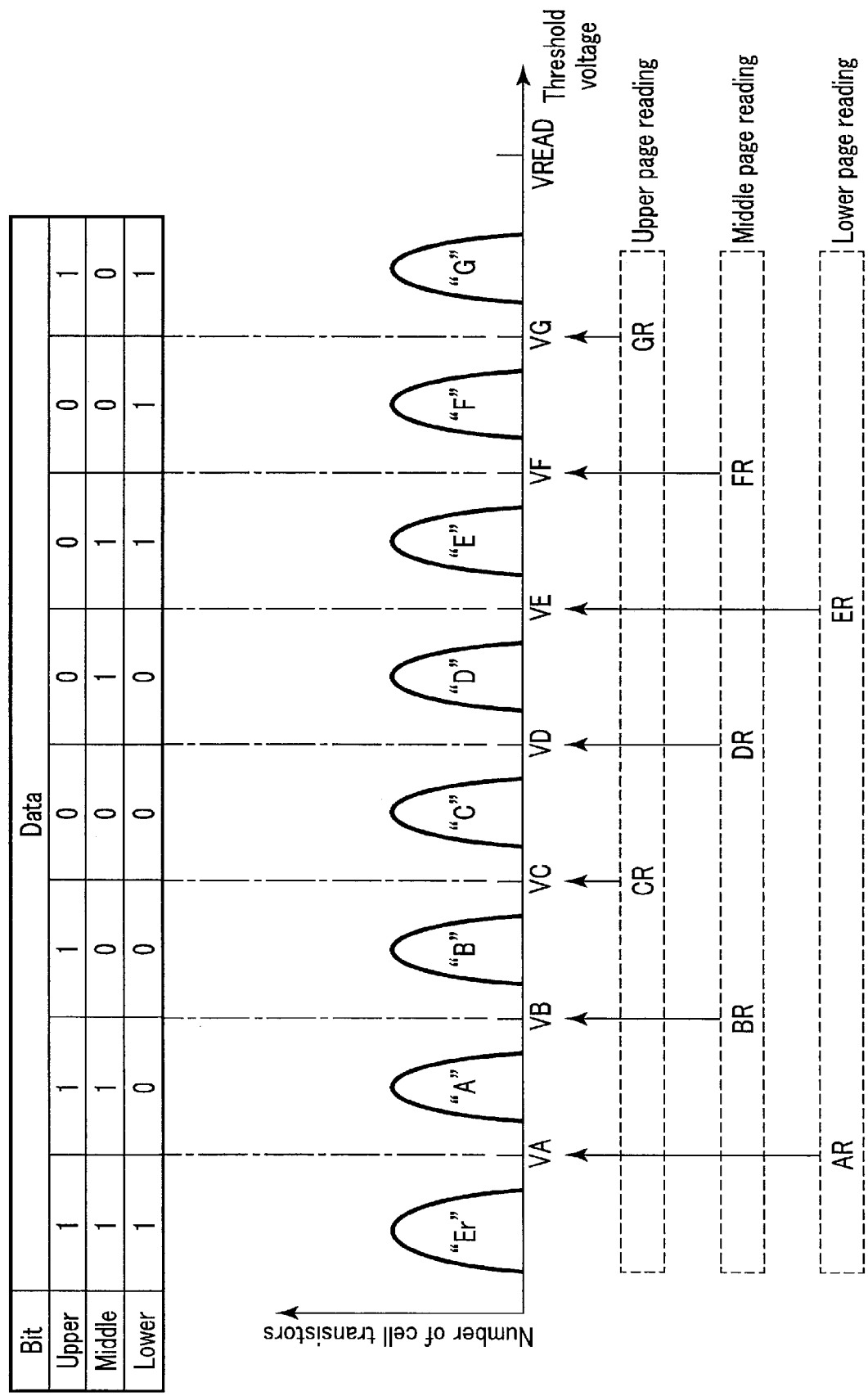
FIG. 3 shows an example of threshold voltage distribution of cell transistors according to the first embodiment.

The cell transistors MT are described by referring to FIG. 3. The memory device 1 is configured to store data of two or more bits in one cell transistor MT. FIG. 3 illustrates distributions of threshold voltages of the cell transistors MT each of which stores three-bit data after writing. The threshold voltage of each cell transistor MT has a value that corresponds to the stored data. For a case of cell transistors MT each storing three bits, each cell transistor MT may have one of eight threshold voltages. The eight threshold voltages are in states of storing data "111", "110", "100", "000", "010", "011", "001", and "101", respectively. The cell transistors MT storing the data "111", "110", "100", "000", "010", "011", "001", and "101" are referred to as being in the states of Er, A, B, C, D, E, F, and G, respectively.

Even if cell transistors MT store the same particular three-bit data, they may have different threshold voltages due to variations of the cell transistors MT in properties, or the like. For this reason, the threshold voltages of the cell transistors MT storing the same three-bit data form one distribution pattern.

In order to determine the data stored in a read-targeted cell transistor MT, the state of that cell transistor MT is determined. For the determination of the state, read voltages VA, VB, VC, VD, VE, VF, and VG are used. Hereinafter, any voltage of a particular magnitude that is applied to a read-targeted cell transistor MT to determine the level, including the voltages VA, VB, and VC, VD, VE, VF, and VG, may be referred to as a read voltage VCGR.

The state of the threshold voltage of a read-targeted cell transistor MT is determined based on whether or not the threshold voltage of that cell transistor MT exceeds a particular read voltage VCGR. The cell transistors MT having threshold voltages larger than or equal to a read voltage VCGR remain off even in receipt of the read voltage VCGR at their control gate electrodes. On the other hand, the cell transistors MT having threshold voltages smaller than a read voltage VCGR turn on upon receipt of the read voltage VCGR in the control gate electrodes. A voltage VREAD is applied to the word lines WL of cell transistors MT that are not of a read-targeted cell unit CU, and is larger than the threshold voltages of the cell transistor MT in any state.

The set of data of bits at the same position (digit position) of the cell transistors MT in one cell unit CU forms one page.

The data of a page, for example, of a lower page can be figured out by reading with a read voltage VA (hereinafter, reading with a read voltage Vβ (where β is A, B, C, D, E, F, or G) will be referred to as reading β) and reading E. In other words, the reading A determines whether the read-targeted cell transistor MT is in the state of Er, or in the state of A, B, C, D, E, F, or G. Thereafter, the reading E determines whether the read-targeted cell transistor MT that is in the state of A, B, C, D, E, F, or G is in the state of A, B, C, or D or in the state of E, F, or G. In case of being in the state of Er, E, F, or G, it is determined that the read-targeted cell transistor MT holds the data "1" in the lower page, whereas in case of being in the state of A, B, C, or D, the read-targeted cell transistor MT holds the data "0" in the lower page.

The same applies to the reading of a middle page and upper page. In reading the middle page, the data held by the read-targeted cell transistor MT in the middle page is figured out by the reading B, reading D, and reading F. In reading the upper page, the data held by the read-targeted cell transistor MT in the upper page is figured out by the reading C and reading G.

1.5. Sense Amplifier

Figure 4:
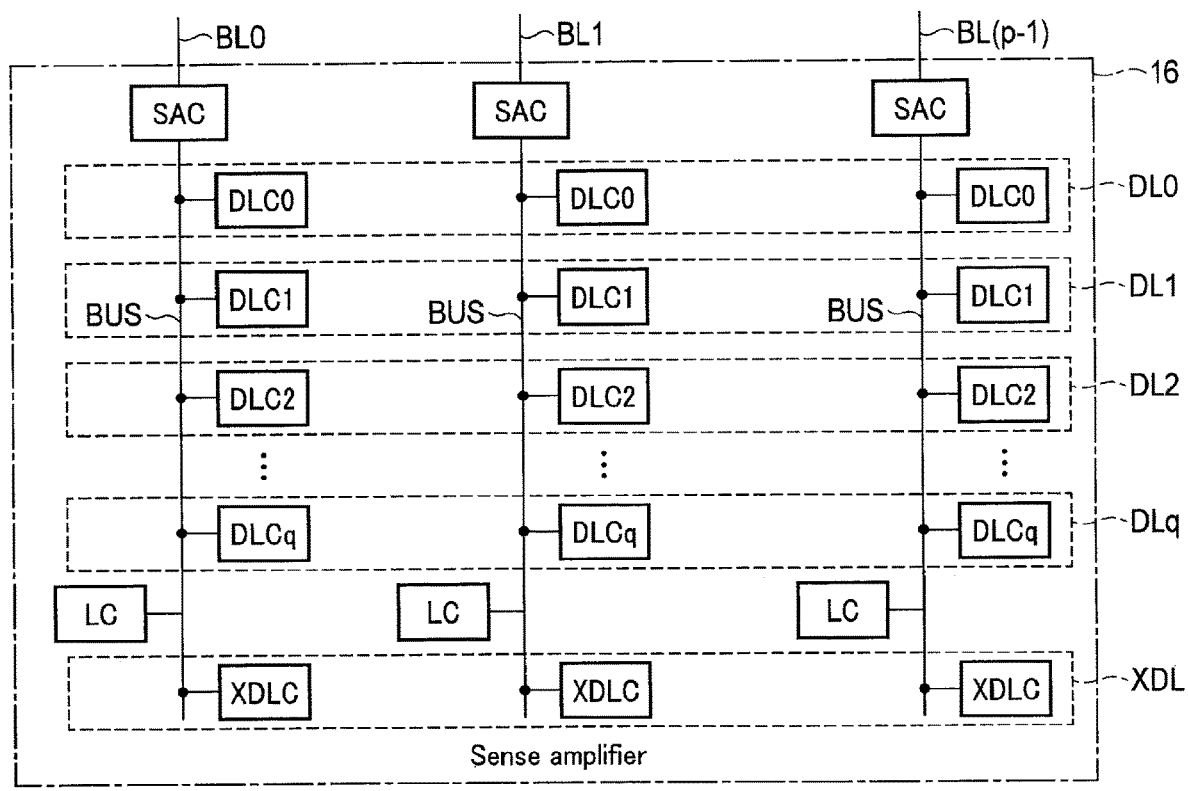
FIG. 4 shows components and connections of a sense amplifier according to the first embodiment.

FIG. 4 shows the components and connections of the sense amplifier 16. The sense amplifier 16 includes p sense amplifier circuits SAC, plural data latches DL (DL0, DL1, DL2, . . . DLq (where q is a natural number)), p arithmetic circuits LC, and a data latch XDL. A data latch DLγ (where γ is 0 or a natural number smaller than or equal to q) includes p data latch circuits DLCγ. The data latch XDL includes p data latch circuits XDLC. The data latch circuits DLC and XDLC are configured to temporarily store the data.

Each bit line BL is coupled to a sense amplifier circuit SAC, q+1 data latch circuits DLC0, DLC1, DLC2, . . . and DLCq, an arithmetic circuit LC, and a data latch circuit XDLC.

During data reading, the sense amplifier circuit SAC is electrically coupled to one read-targeted cell transistor MT via a bit line BL coupled to this sense amplifier circuit SAC. Thereafter, the sense amplifier circuit SAC senses the voltage of a magnitude which is determined based on the threshold voltage of the read-targeted cell transistor MT, on a node in the sense amplifier circuit SAC. Based on the result of this sensing, it can be determined as to which of the two states the cell transistor MT electrically coupled to the sense amplifier circuit SA belongs to. The two states of the cell transistor MT are represented by the data "0" or data "1". The sense amplifier circuit SAC holds the read data being data "0" or data "1", in a data latch circuit DLC that is coupled to the sense amplifier circuit SAC.

Each arithmetic circuit LC is configured to execute logical operations on the data held in the data latch circuits DLC and XDLC that are coupled to that arithmetic circuit LC. Examples of the logical operations include NOT, OR, AND, exclusive OR (XOR), and exclusive NOR (XNOR).

1.6. ECC Circuit and Associated Components

Figure 5:
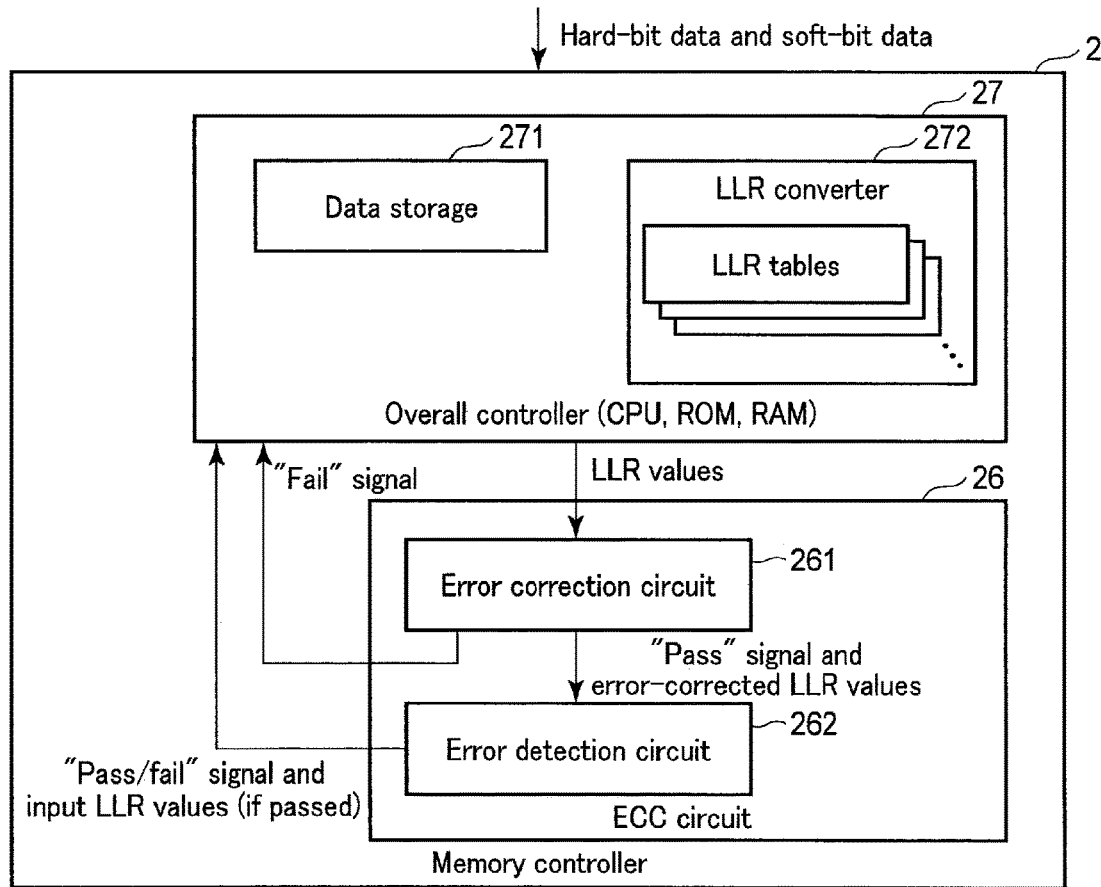
FIG. 5 is a functional block diagram showing components and connections of an ECC circuit according to the first embodiment, and components of a memory controller that are related to the ECC circuit.

FIG. 5 is a functional block diagram showing the components and connections of the ECC circuit 26, and the components of the memory controller 2 that are related to the ECC circuit 26. The memory controller 2 includes an overall controller 27. The overall controller 27 is realized by a combination of part of the functions of the CPU 22, RAM 23, and ROM 24.

The overall controller 27 controls the overall operation of the memory controller 2. Such a control includes the processing that relates to the operation of the ECC circuit 26. In an attempt to correct errors in the data that is read from the memory device 1, the overall controller 27 instructs the memory device 1 via the memory interface 25 to read data necessary for the error correction. The data necessary for the error correction includes hard-bit (HB) data and soft-bit (SB) data. The overall controller 27 is further configured to determine a log likelihood ratio (LLR) values from the hard-bit data and soft-bit data. The overall controller 27 includes a data storage 271 and an LLR converter 272. The data storage 271 may be realized by the function of the RAM 23, and stores the hard-bit data and soft-bit data.

The hard-bit data is the data that is read from a read-targeted page (selected page) in a read-targeted cell unit (selected cell unit) by lower page reading, middle page reading, or upper page reading. The hard-bit data may be one page in size, and includes a bit (hard-bit) string based on the result of reading data from cell transistors (selected cell transistors) MT of the selected cell unit CU. The soft-bit data also includes a string of soft bits, each of which represents information about one selected cell transistor MT. The soft-bit data represents, in each bit, the result of a logical operation executed on a plurality of bits that are read from a selected cell transistor MT corresponding to that bit under different conditions. The soft-bit data includes various types of data depending on the details of the operations. The hard-bit data and soft-bit data will be further described later.

The LLR converter 272 may convert a combination of bits in the hard-bit data and soft-bit data that are associated with each other, to an LLR value corresponding to this combination. Each of the combinations of bits is referred to as an LLR label. Each LLR value represents a likelihood of a hard-bit value ("0" or "1") associated with this LLR value.

The LLR converter 272 recognizes the relationship between LLR labels having different values and the corresponding LLR values. The conversion may be achieved using an LLR table. The LLR converter 272 may store a plurality of LLR tables. The LLR tables may be stored in a memory system 5 in advance, for example, prior to the shipment of the memory system 5 from the factory. The LLR converter 272 may make corrections to the relationship between LLR labels in an LLR table and the LLR values, and execute the conversion using the corrected relationship.

The ECC circuit 26 includes an error correction circuit 261 and an error detection circuit 262. The error correction circuit 261 receives LLR values from the overall controller 27, and implements hard-bit (HB) decoding with BCH codes, Reed-Solomon codes or the like, and soft-bit (SB) decoding with LDPC, or the like, onto the LLR values. The error correction circuit 261 may execute decoding for each data having a size, for example, of a "frame". As a result of a successful error correction, a group of LLR values that have been error-corrected (set of LLR values) can be obtained. When the error correction is succeeded, the error correction circuit 261 outputs a signal indicative of a "pass" determination and the error-corrected set of LLR values. On the other hand, when the error correction fails, the error correction circuit 261 notifies the overall controller 27 of a "fail" determination.

The signal indicative of "pass" and the error-corrected set of LLR values are input to the error detection circuit 262. The error detection circuit 262 checks, for example by using parities, whether or not the input set of LLR values includes any error. As mentioned above, the data read from the memory device 1 includes the substantial write data and the corresponding parities. This means that the set of LLR values includes the LLR values that relate to the substantial write data and the LLR values that relate to the parities. The error detection circuit 262 may use the LLR values in the set of LLR values that correspond to the parities to detect any error in the substantial write data and parities in the set of LLR values.

If any error is contained, the error detection circuit 262 supplies the signal indicative of the "fail" determination to the overall controller 27. If no error is contained, the error detection circuit 262 determines that the error correction made by the error correction circuit 261 appears reliable, and supplies the signal indicative of the "pass" determination to the overall controller 27, while supplying the input (i.e., error-corrected) set of LLR values to the overall controller 27 (the RAM 23, in particular). The overall controller 27 may extract, from the error-corrected set of LLR values, the data requested by the host device 3 or the memory controller 2 to be read from the memory device 1.

Figure 6:
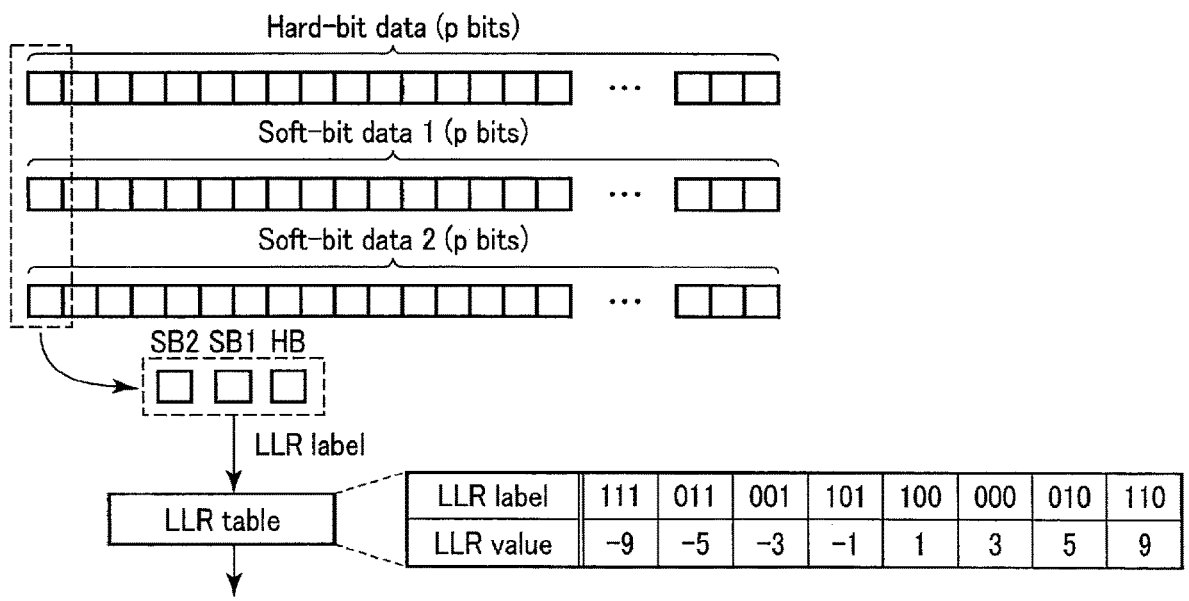
FIG. 6 shows examples of hard-bit data, soft-bit data, LLR labels, and LLR values according to the first embodiment.

FIG. 6 illustrates an example for the hard-bit data, soft-bit data, LLR labels, and LLR values, where two types of soft-bit data, namely soft-bit data 1 and soft-bit data 2, are adopted. Each square in FIG. 6 shows one bit of hard-bit data (HB), soft-bit data 1 (SB1), and soft-bit data 2 (SB2). The squares vertically aligned in FIG. 6 represent bits of a selected cell transistor MT. The hard-bit data having a size of one page includes p bits, where the number p is equal to the number p of cell transistors MT in one cell unit CU. Similarly, each of the soft-bit data 1 and soft-bit data 2 includes p bits.

The soft-bit data includes a string of bits (soft bits) based on the data read from the cell transistors MT of the selected page under different conditions. Each soft bit carries information about one selected cell transistor MT, and is adopted for the determination of an LLR value for the hard bit of this selected cell transistor MT.

For one selected cell transistor MT, a hard bit, a soft bit in the soft-bit data 1, and a soft bit in the soft-bit data 2 form one set. One set includes three-bit data, and corresponds to a value of one LLR label. Different combinations of these three bits result in different LLR labels.

As discussed above, each LLR label is converted by the LLR converter 272 to an LLR value. Each of the LLR values has a positive or negative value. For convenience of understanding, the LLR value is expressed in decimal digits in the drawings as well as in the description below.

2. Operations

Figure 7:
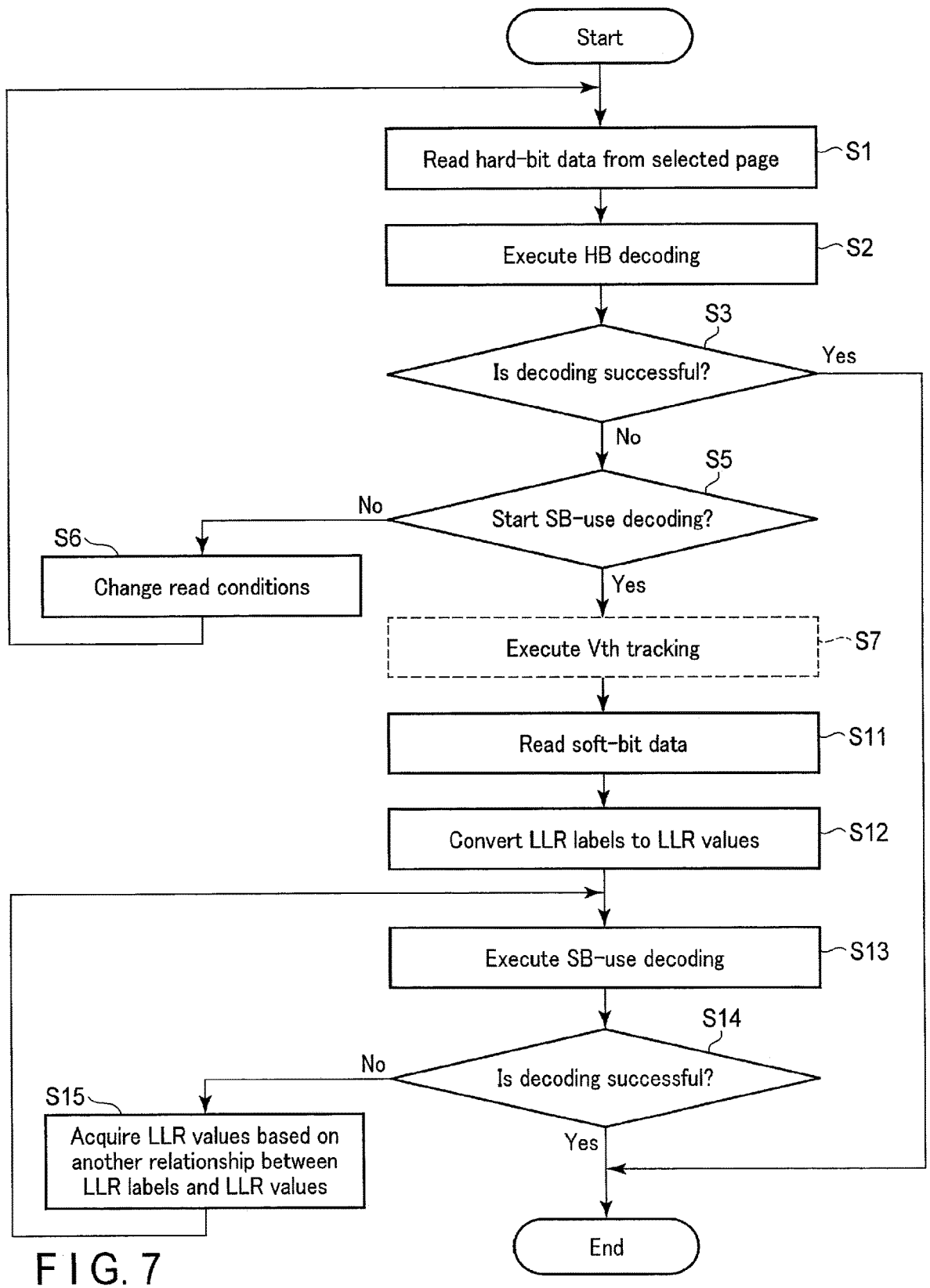
FIG. 7 is a flowchart of part of the operation of the memory system according to the first embodiment.

FIG. 7 is a flowchart of part of the operation of the memory system 5. This flowchart indicates part of the operation of the memory system 5 reading the data from one page. In particular, the start to the end of acquisition of one-frame sized data out of the data read from a page is shown. The details of some of the steps will be provided later.

At Step S1, the memory controller 2 reads one-page sized data from the selected page. For the data reading, a read voltage VCGR that is meant to be initially used, such as a default voltage, may be adopted. The read-out data, or in other words, hard-bit data, is stored in the RAM 23. This hard-bit data includes parity bits corresponding to the bits for the substantial write data.

At Step S2, the memory controller 2 attempts to correct errors (HB decoding) in the hard bit data by using the substantial write data and the parities in the hard-bit data. If the decoding is successful (Yes at Step S3), the flow is completed. If the decoding fails (No at Step S3), the memory controller 2 determines at Step S5 whether or not to start the decoding by use of the soft-bit data (SB-use decoding), including, for example, decoding by use of LLR values (SB decoding). The SB-use decoding is initiated when a predetermined condition is satisfied, and may be initiated if the operations of the data reading and HB decoding, which are executed several times while changing the conditions for reading at the following Step S6, have all failed.

Figure 8:
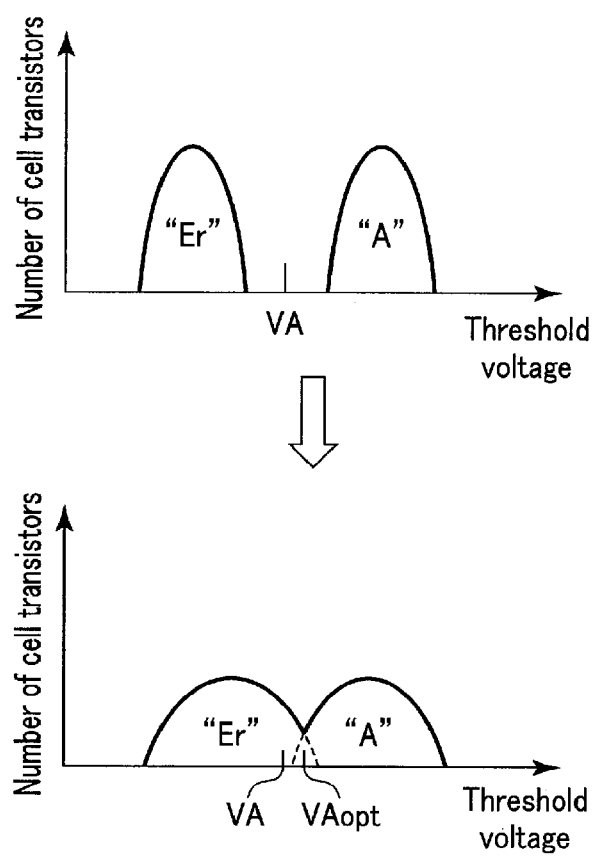
FIG. 8 shows a change of the threshold voltage distribution according to the first embodiment.

If the SB-use decoding should not be started (No at Step S5), the memory controller 2 changes the conditions for reading at Step S6. In FIG. 3, with the threshold voltage distribution curves independent from each other, it is highly likely that correct page data can be read out using the default read voltages VA, VB, VC, VD, VE, VF, and/or VG, by HB decoding, or even without HB decoding. That is, as can be seen from the threshold voltage distributions in the states of Er and A immediately after the writing, which is illustrated in the upper half of FIG. 8, the default read voltage VA is positioned between the threshold voltage distributions in the states of Er and A immediately after the writing. The threshold voltage distributions, however, may change due to various factors including disturbance and move of electrical charge. As a result, the threshold voltage distributions may be widened or moved to overlap with each other, as illustrated in the lower half of FIG. 8. If this is the case, the use of the default read voltage VA may not lead to the acquisition of correct page data (written data). In order to address such a situation, changing the read condition may include changing the default read voltage VCGR by increasing or reducing it for a predetermined level. The read voltage VCGR may be changed by designating its level by every minimal unit that has been predetermined. The minimal unit may be 3DAC or −3DAC. Changing the read condition may include estimating a better level of the read voltage VCGR and changing the read voltage VCGR to the estimated better level.

Estimating the better read voltage VCGR may include what is called "Vth tracking". As indicated in the lower half of FIG. 8, a read voltage VAopt, which corresponds to the local smallest value in the threshold voltage distribution curve, is more likely to result in better reading (i.e., the higher success rate of error correction). In order to find the local smallest values in the threshold voltage distribution curve, the memory controller 2 may perform the Vth tracking. As a result of this Vth tracking, the memory controller 2 acquires the voltages at the local smallest positions (local smallest voltages) in the threshold voltage distribution curve. The Vth tracking includes repeating the data reading while changing the level of read voltage VCGR, and estimating the optimal read voltages VA, VB, VC, VD, VE, VF, and/or VG.

The Vth tracking may be performed to estimate the local smallest voltages that are required for reading from a selected page only, or to estimate the smallest voltages that are required for reading from the entire page of the selected cell unit CU. The result of the Vth tracking may be stored in the RAM 23, as values shifted from the default read voltages VCGR. This result may be used when reading the next data from the selected page or from the selected cell unit CU. The result of the Vth tracking may be stored for each cell unit CU. Alternatively, the result of the Vth tracking for a cell unit CU may be employed for other cell units CU that are aligned with this cell unit CU.

In FIG. 7, Step S6 goes back to Step S1.

Determining at Step S5 that the SB-use decoding should be initiated, the memory controller 2 executes the Vth tracking (Step S7). If the Vth tracking has already been executed at Step S6, the process flow may skip Step S7 and move onto Step S11, where the local smallest voltages obtained at Step S6 can be used.

At Step S11, the memory controller 2 obtains all the soft-bit data necessary for the SB decoding of the hard-bit data of the selected page in accordance with the SB decoding method adopted by the error correction circuit 261. In particular, the memory controller 2 may set variable i=1 to read the soft-bit data 1 from the memory device 1. As incrementing i by 1 each time, the memory controller 2 obtains the soft-bit data 1, soft-bit data 2, soft-bit data 3, . . . . The soft-bit data may be obtained in any order. Where the value i differs, the soft-bit data 1, soft-bit data 2, soft-bit data 3, . . . may differ, and which of the soft-bit data is required depends on the SB decoding method that is adopted by the error correction circuit 261. An example of the soft-bit data will be discussed later. As a result of acquiring all the necessary soft-bit data, the memory controller 2 will have obtained p LLR labels for the p selected cell transistors MT.

At Step S12, the LLR converter 272 converts the p LLR labels respectively to p LLR values by using the predetermined relationship between the LLR labels and LLR values, such as an LLR table, thereby acquiring p LLR values.

At Step S13, the ECC circuit 26 attempts to decode the hard-bit data with the LLR values obtained at Step S12 to obtain error-corrected hard-bit data. For this purpose, the ECC circuit 26 may execute the SB decoding by use of the LLR values. Since the ECC circuit 26 performs the processing for each frame as discussed above, the overall controller 27 supplies, to the error correction circuit 261, m LLR values (targeted set of LLR values) out of all the LLR values for all the bits in the read-targeted page. If there is no error detected by the error detection circuit 262, it is determined that the decoding of the frame now being processed is successful. When the decoding is successful (Yes at Step S14), the ECC circuit 26 sends a notification ("pass" determination from the error detection circuit 262) to the overall controller 27. Upon receipt of this notification, the overall controller 27 acknowledges the successful decoding of the targeted set of LLR values. The overall controller 27 receives back the targeted set of LLR values that has been error-corrected, and obtains the error-corrected hard-bit data from the error-corrected targeted set of LLR values. The process flow is thereby completed.

Alternatively, the ECC circuit 26 may execute the HB decoding at Step S13. That is, the ECC circuit 26 may derive a hard decision value from the LLR value and execute the decoding based on the hard decision value. The hard decision value represents the sign of an LLR value, where the hard decision values of negative and positive LLR values are 1 and 0, respectively. The set of hard decision values for the LLR values in the set of LLR values contain multiple bits as is the case with the hard-bit data read from the selected page. The decoding is executed onto this set of hard decision values, or in other words, the hard-bit data. For the hard-bit data obtained at Step S13, the information of the soft-bit data has been reflected, and therefore this hard-bit data is different from the hard-bit data obtained at Step S1. In view of this, the HB decoding at Step S13 may turn out to be successful.

In case the error correction conducted by the error correction circuit 261 fails, or in case an error is detected by the error detection circuit 262 (No at Step S14), a notification to this effect is sent to the overall controller 27. Upon receipt of this notification, the overall controller 27 acknowledges that the decoding of the targeted set of LLR values has failed, and executes the operation at Step S15. At this step, the overall controller 27 re-converts the LLR labels of the read-targeted page to LLR values in a different manner. For example, the LLR converter 272 under the control of the overall controller 27 may use an LLR table that is different from the LLR table (hereinafter referred to as the "initial LLR table") used for the first conversion from the LLR labels to the LLR values at Step S12 in the process flow, or may correct the initial LLR table, to convert the LLR labels to the LLR values. The LLR labels before the conversion of the target LLR values for which the decoding has failed at Step S13 may be determined as the target of the re-conversion. All of the p LLR labels may also be re-converted.

Step S15 goes back to Step S13. At Step S13, the overall controller 27 supplies to the FCC circuit 26 the LLR values obtained by the re-conversion. The supplied LLR values may be of the selected cell transistor MT that is the same selected cell transistor MT corresponding to the LLR values that have been previously input at the decoding of Step S14.

2.1. Step S13 (Soft-Bit Data Reading)

Figure 9:
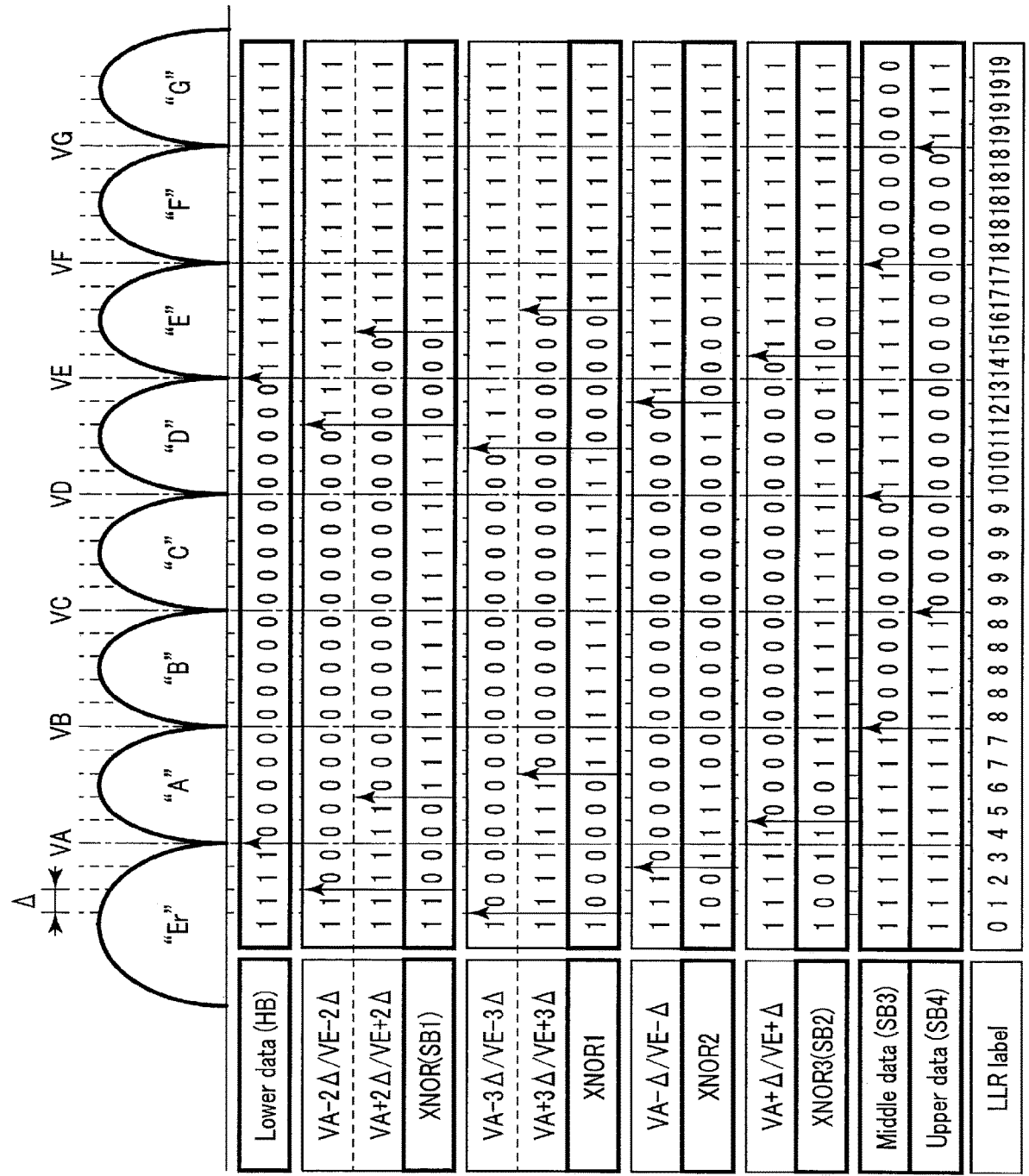
FIG. 9 shows examples of the hard-bit data, soft-bit data, and LLR labels according to the first embodiment.

An example of Step S13 in FIG. 7 will be described by referring to FIG. 9. FIG. 9 describes an example of the hard-bit data, soft-bit data 1, soft-bit data 2, soft-bit data 3, soft-bit data 4, and LLR labels when the lower page is the read-targeted page. The read voltages VA, VB, VC, VD, VE, VF, and VG may correspond to the local smallest voltages estimated by the Vth tracking at Step S6 or S7 in FIG. 7.

As indicated in the first row of FIG. 9, the hard-bit data in the lower page has data "1" for any bits corresponding to the cell transistors MT having the threshold voltage lower than the voltage VA and the threshold voltage larger than or equal to the voltage VE, and has data "0" for any bits corresponding to the cell transistors MT having the threshold voltages larger than or equal to the voltage VA and smaller than the voltage VE.

In order to acquire the soft-bit data 1, the memory controller 2 first acquires the data that can be read with a voltage that is lower by a certain magnitude than the voltage VA and a voltage higher by a certain magnitude than the voltage VE. The difference between the to-be-used voltage and each of the voltages VA and VE may be $-2\Delta$. That is, the memory controller 2 uses voltage VA$-2\Delta$ and voltage VE$-2\Delta$ as read voltages in place of the voltages VA and VE, where $\Delta$ may be set to any magnitude, and instructs the memory device 1 to store the result of the lower page reading in any of the data latches DL. The value $\Delta$ may be equal to an integral multiple of the predetermined to-be-increased or to-be-decreased amount of the read voltage VCGR that can be instructed to the memory device 1. Upon receipt of the instruction, the memory device 1 executes the data reading as instructed. The result of the lower page reading with the voltages VA$-2\Delta$ and VE$-2\Delta$ is described in the second row of the chart. The bits corresponding to the cell transistors MT having threshold voltages lower than the voltage VA$-2\Delta$ and threshold voltages higher than the voltage VE$-2\Delta$ exhibit data "1", and the bits corresponding to the cell transistors MT having threshold voltages higher than or equal to the voltage VA$-2\Delta$ and lower than the voltage VE$-2\Delta$ exhibit data "0". The data read to the data latch by the lower page reading using the difference M (e.g., $-2\Delta$) will be referred to as "M lower page data". The $-2\Delta$ lower page data is stored in a data latch (e.g., data latch DL0) of the memory device 1.

In a manner similar to the above, the memory controller 2 instructs the memory device 1 to execute the lower page reading using the voltages VA$+2\Delta$ and VE$+2\Delta$ as read voltages, in place of the voltages VA and VE. The result of the reading is stored in another data latch (e.g., data latch XDL) of the memory device 1.

Next, the memory controller 2 instructs the memory device 1 to execute an exclusive NOR (XNOR) operation onto the data in the data latch DL0 and the data in the data latch XDL. Upon receipt of this instruction, the memory device 1 executes the XNOR operation on the data in the data latch DL0 and the data in the data latch XDL. In particular, the sequencer 13 uses, as an input, two bits at the same positions in the data of the data latch DL0 and the data of the data latch XDL to execute the XNOR on the two input bits using a arithmetic circuit LC, and executes this operation onto all of the bits in the data latch DL0 and data latch XDL. The result of the operation is stored in a data latch (e.g., the data latch XDL). In particular, the sequencer 13 executes the XNOR operation on the data in the data latch circuit DLC0 and on the data in the data latch circuit XDLC that is coupled to this data latch circuit DLC0, using the arithmetic circuit LC coupled to these data latch circuits DLC0 and XDLC. The result of the operation is stored in the data latch circuit XDLC that is coupled to the data latch circuits DLC0 and XDLC that store the input data of the logical operation. The data thereby stored in the data latch XDL is the soft-bit data 1. Thereafter, the soft-bit data 1 is transmitted to the memory controller 2, where it is stored in the data storage 271.

In a manner similar to the above, the soft-bit data 2 is acquired through several operations of reading data from the selected page to the data latch DL and also through several logical operations. First, the result of the XNOR operation executed on $-3\Delta$ lower page data and $3\Delta$ lower page data is acquired (XNOR1 data). Then, the result of the XNOR operation executed on the XNOR1 data and −Δ lower page data is acquired (XNOR2 data), and the result of the XNOR operation executed on the XNOR2 data and Δ lower page data is acquired (XNOR3 data). The XNOR3 data, which is the soft-bit data 2, is transmitted to the memory controller 2 and stored in the data storage 271.

The memory controller 2 further instructs the memory device 1 to read data in the middle page and the upper page from the selected cell unit CU to acquire the middle page data and the upper page data. The middle page data is to be dealt with as the soft-bit data 3, and the upper page data is to be dealt with as the soft-bit data 4.

Of the hard-bit data and various soft-bit data, a set of bits obtained as the result of data reading from the same selected transistor MT forms one LLR label. The number of bits in a set that constitute one LLR label depends on the method of error correction by the ECC circuit 26, and the number of bits does not restrict the embodiment. In the example of FIG. 6, a set of three bits forms one LLR label. On the other hand, in the example of FIG. 9, a set of five bits of the data of the hard-bit data and soft-bit data 1 to 4 that is read from the same selected cell transistor MT forms one LLR label. Each LLR label has a unique value for a combination of five bits. In the drawing, these LLR labels are expressed in decimal digits.

The soft-bit data (soft-bit data 1 to 4) may also be generated by the memory controller 2, or in particular by the overall controller 27. To realize this, the memory controller 2 receives from the memory device 1 the M lower page data for the calculation of the soft-bit data 1 to 4 with respect to different values of M. Then, the memory controller 2 executes the logical operation onto the received M lower page data to generate the soft-bit data 1 to 4.

2.2. Step S15 (Change of Conversion Method of LLR Label)

FIGS. 10 and 11 illustrate the changes of the method for converting the LLR labels to LLR values. The conversion at Step S12 may currently be executed using the second (middle) LLR table from the top of FIG. 10. Thereafter, at Step S15, the overall controller 27 may use the top or bottom LLR table in FIG. 10. According to the top LLR table, each LLR label is converted to an LLR value that is greater by 1 than the corresponding LLR value in the middle LLR table. According to the bottom LLR table, each LLR label is converted to an LLR value that is smaller by 1 than the corresponding LLR value in the middle LLR table. The absolute value of this increment may be greater than 1.

Alternatively, at Step S15, the overall controller 27 may use the top or bottom LLR table in FIG. 11. According to the top LLR table, each LLR value is shifted to the right by 1. That is, according to this top LLR table, the LLR labels 1 to 19 are converted to the LLR values that correspond to the values for the LLR labels 0 to 18, respectively, according to the middle LLR table. For example, the LLR label 0 is converted to the LLR value of −9. According to the bottom LLR table, the LLR value is shifted to the left by 1. That is, according to the bottom LLR table, the LLR labels 0 to 18 are converted to the LLR values that correspond to the LLR labels 1 to 19, respectively, according to the middle LLR table. For example, the LLR label 19 is converted to the LLR value of −9.

If the operation at Step S15 is to be re-executed after Step S14, any of the changed LLR tables illustrated in FIGS. 10 and 11 may be adopted. That is, if the operation at Step S15 is to be repeated, any combination of the top table and bottom table in FIG. 10 and the top table and bottom table in FIG. 11 may be adopted in any order through the repeated operations of Step S15.

Alternatively, an LLR table that is completely different from the initially used LLR table (the middle LLR table in FIGS. 10 and 11) may be adopted at Step S15.

The above description has been given with regard to an example of reading data from the lower page. The first embodiment, however, is not limited to this example, and may be applied to the data reading from the middle page and/or upper page.

3. Advantageous Features

According to the first embodiment, the efficiency of the SB-use decoding by the memory controller 2 can be improved, as described below.

In case the SB-use decoding fails, the soft-bit data can be re-acquired. Specifically in the example of FIG. 7, if the decoding at Step S14 fails, the process flow may be returned to Step S11 by while discarding the soft-bit data used for decoding at Step S13. For the re-acquisition of the soft-bit data, however, the data reading may need to be repeated, which requires time.

Meanwhile, the failed SB-use decoding may result in a gap between the local smallest value in the threshold voltage distribution curve and the optimal read voltage (i.e., voltage at which the minimum fail bit count (FBC) can be achieved in the hard-bit data of the selected page). The LLR table is prepared to provide LLR values for the LLR labels that have been acquired using the read voltages that can achieve the minimum FBC (minimum FBC voltage). In reality, since the minimum FBC voltage is very difficult to be estimated, a local smallest voltage is estimated by the Vth tracking. On the assumption that the estimated local smallest voltage can achieve the minimum FBC, this smallest local voltage is used as the minimum FBC voltage. The success rate of the SB-use decoding depends on the accuracy of the Vth tracking.

Figure 12:
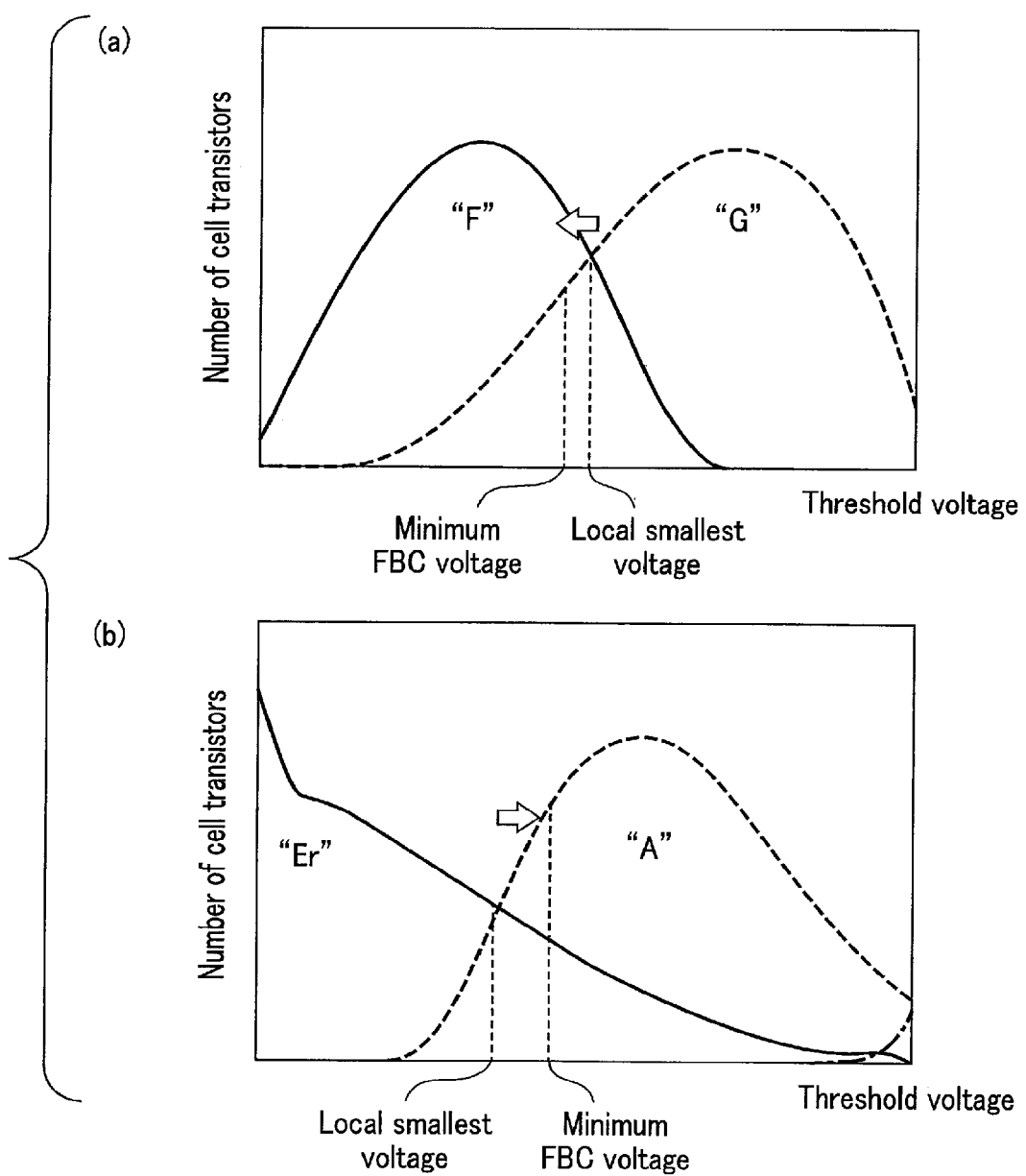
FIG. 12 shows boundaries of threshold voltage distributions.
Figure 13:
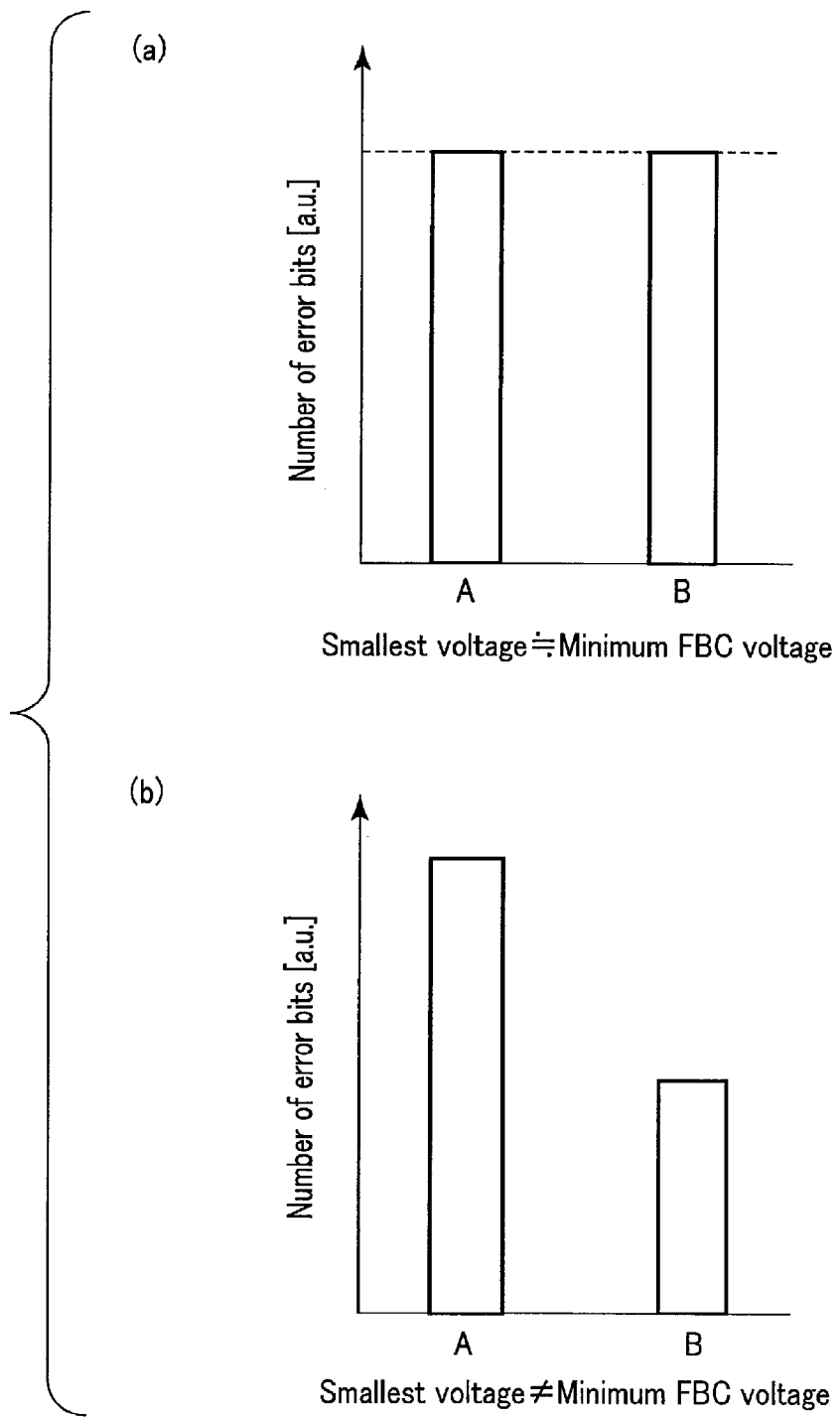
FIG. 13 shows error correction capabilities in some cases.

There are some specific threshold distribution boundaries, however, in which a gap appears between the minimum FBC voltage and the local smallest voltage. In section (a) of FIG. 12, the boundary between the distribution curves of the states of F and G is illustrated as an example. In some boundaries of the states including this example, only a small gap exists between the minimum FBC voltage and the local smallest voltage. In contrast, as illustrated in section (b) of FIG. 12, a large gap between the minimum FBC voltage and the local smallest voltage appears in the boundary between the states of Er and A. If there is a large gap between the minimum FBC voltage and the local smallest voltage, the state of the cell transistor MT having the threshold voltage in this range may be erroneously determined. FIG. 13 describes such errors.

The error correction capability for different cases is shown in FIG. 13, where the vertical axis indicates the number of error bits in the error-corrected data. In FIG. 13, section (a) demonstrates a situation in which the gap between a local smallest voltage and the minimum FBC voltage is small, while section (b) demonstrates a situation in which the gap between a local smallest voltage and the minimum FBC voltage is large. The section (a) indicates as an example the reading of a page that does not require the distinction between the states of Er and A, such as the case of the reading of a middle page. The section (b) indicates the reading of a lower page that requires the distinction between the states of Er and A. Situation A indicates the use of a default LLR table, which may be commonly observed in the actual use of the memory system 5. Situation B, on the other hand, indicates the use of the optimal LLR table for the current read-targeted page, which is prepared merely for discussion and therefore cannot occur in the actual use of the memory system 5.

In section (a), with the local smallest voltage not significantly different from the minimum FBC voltage, the error correction capability using the local smallest voltage and default LLR table (situation A) does not demonstrate any considerable difference with respect to the error correction capability using the local smallest voltage and the optimal LLR table (situation B). On the other hand, in section (b), with the local smallest voltage significantly different from the minimum FBC voltage, the error correction function using the local smallest voltage and default LLR table (situation A) demonstrates a significant difference with respect to the error correction function using the local smallest voltage and the optimal LLR table (situation B). From a different aspect, however, section (b) implies that, although the preparation of the optimal LLR table may not be technically possible, the use of a more suitable LLR table may improve the error correction function even when the local smallest voltage is significantly different from the minimum FBC voltage.

The memory controller 2 according to the first embodiment is configured to, if the SB-use decoding fails, re-convert an LLR label to an LLR value using an LLR table that is different from the LLR table that has been used for the conversion to the LLR value in the failed SB-use decoding. The LLR value that is converted in accordance with the different LLR table may result in successful SB-use decoding. This change to a new LLR table does not require the process of newly acquiring an LLR label. This means that the SB-use decoding newly attempted after the failed SB-use decoding does not require the re-acquisition of soft-bit data. As a result, the memory controller 2 according to the first embodiment can achieve the successful SB-use decoding in a shorter length of time than the re-execution of the SB-use decoding that includes the re-acquisition of the soft-bit data.

Embodiment 2

The second embodiment relates to the details of the first embodiment.

The memory system 5 according to the second embodiment includes the same components and connections as those of the memory system 5 according to the first embodiment. The memory controller 2 according to the second embodiment is configured to execute the operations described below. In particular, the memory controller 2 is configured so that the firmware of the ROM 24 causes the memory controller 2 to execute the operations as described below.

Figure 14:
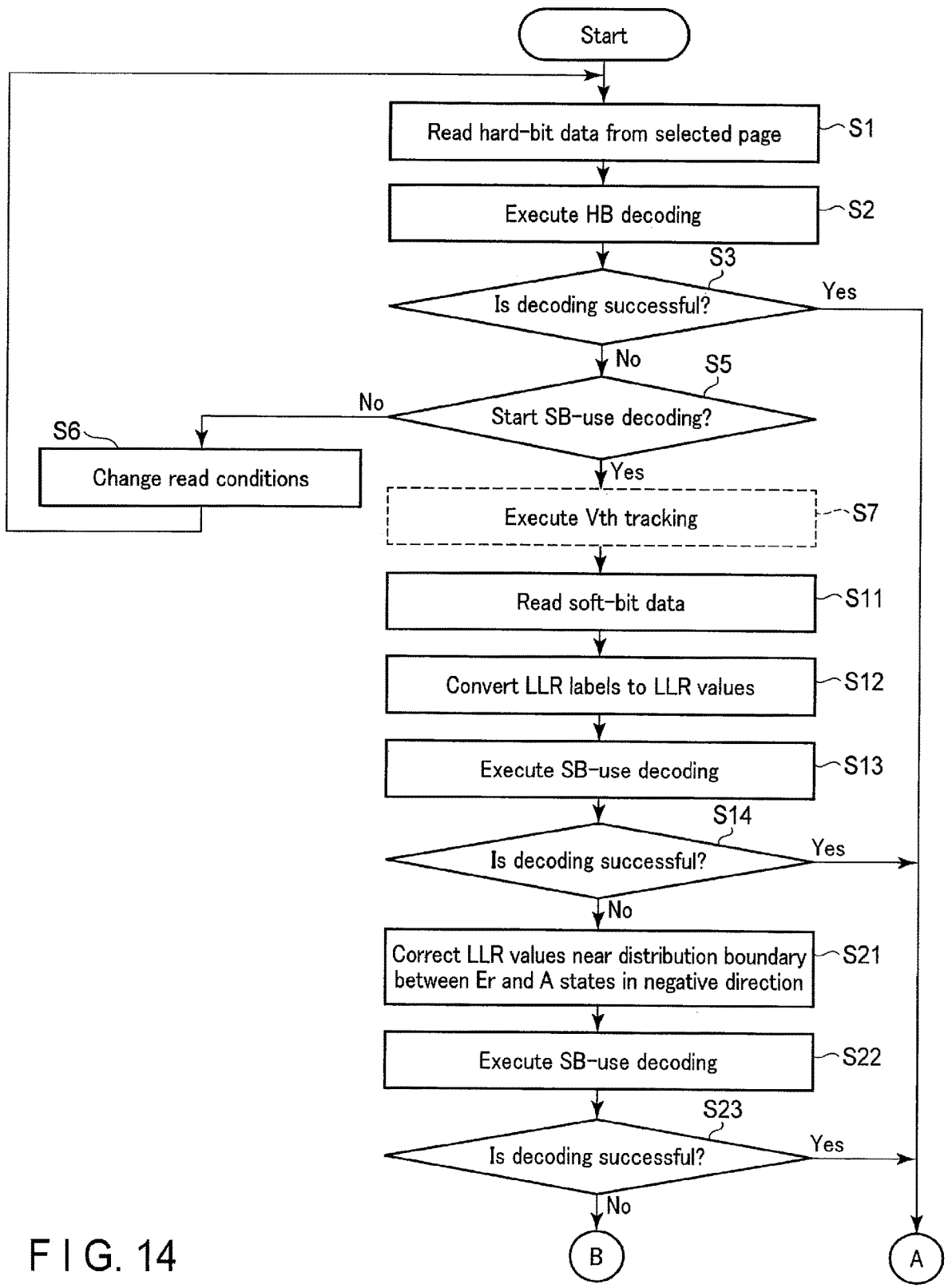
FIG. 14 is a flowchart of part of the operation of a memory system according to the second embodiment.
Figure 15:
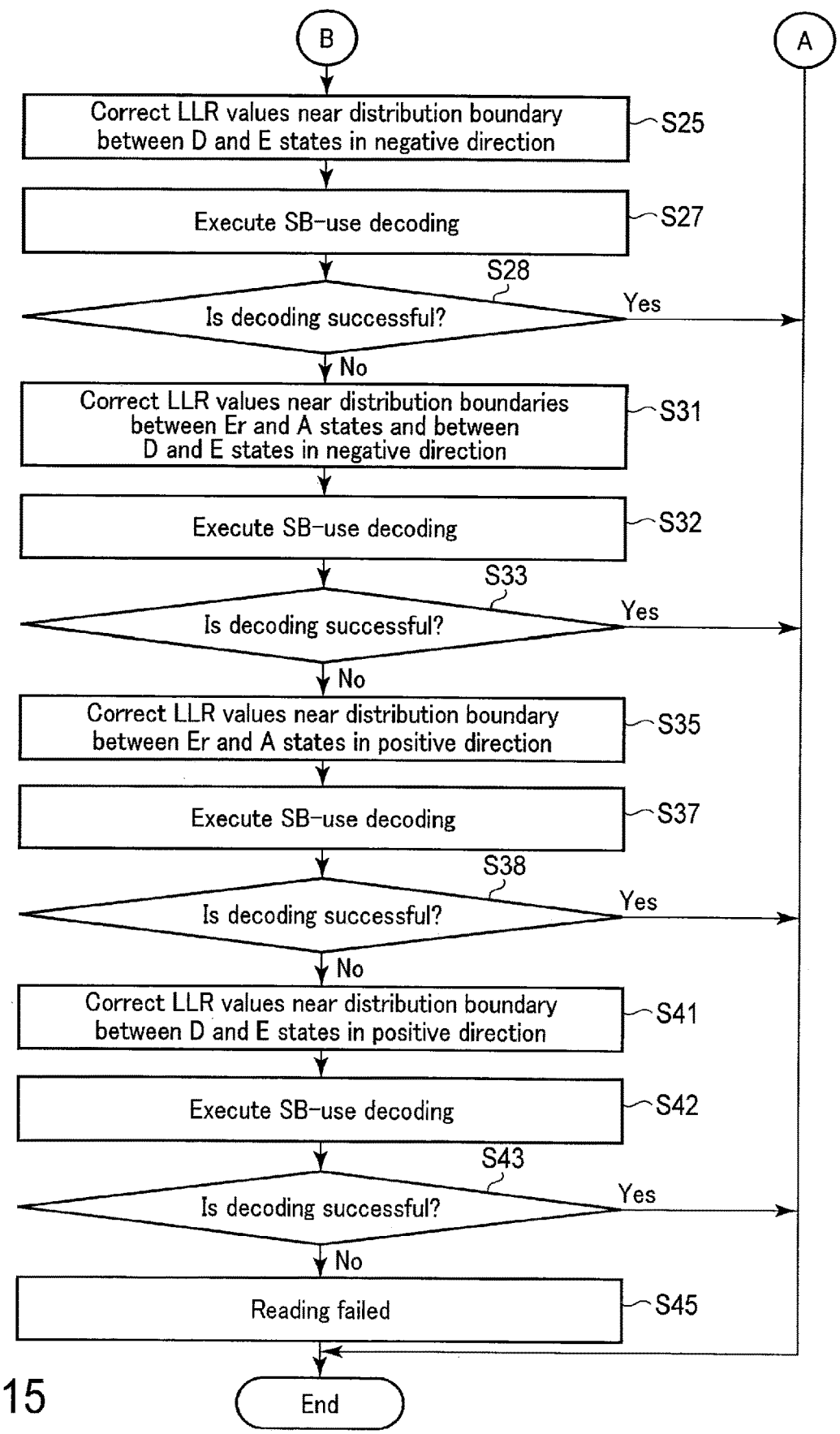
FIG. 15 is a flowchart continued from FIG. 14.

FIGS. 14 and 15 show a flow of part of the operations of the memory system 5 according to the second embodiment. This flow indicates part of the operations of the memory system 5 for reading the data from a lower page. In particular, the start to the end of acquiring data of a one-frame size in the data reading from a page is indicated.

Figure 16:
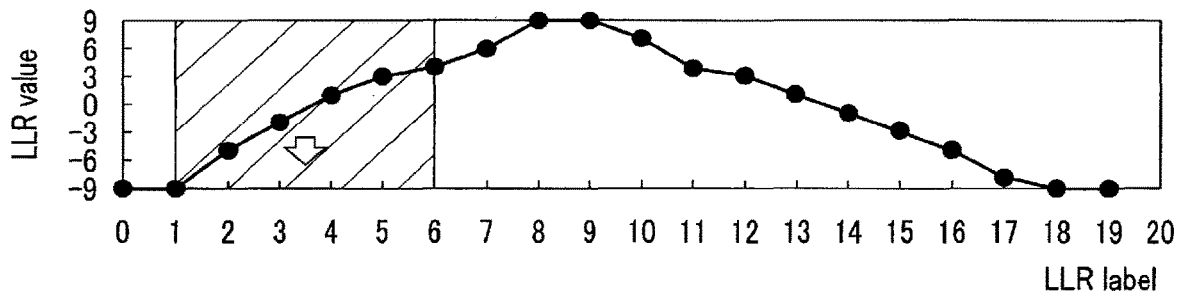
FIG. 16 shows the first example of LLR table corrections according to the second embodiment.

In a manner similar to the first embodiment, the memory controller 2 executes, as shown in FIG. 14, the operations at Steps S1, S2, S3, S5, S6, S7, S11, S12, S13, and S14, which have been described with reference to FIG. 7. When the SB-use decoding fails (No at Step S14), the processing flow proceeds to Step S21. At Step S21, the overall controller 27 corrects the LLR value of an LLR label in a negative direction with respect to the corresponding LLR value in the initial LLR table. The LLR label converted to the corrected LLR value corresponds to the threshold voltage in the vicinity of the boundary between the Er-state distribution and A-state distribution. When the conversion is based on the LLR table of FIG. 10, the LLR values for LLR labels 1, 2, 3, 4, 5, and 6 will be corrected, as illustrated in FIG. 16. The correction has a magnitude of, for example, 1.

Figure 17:
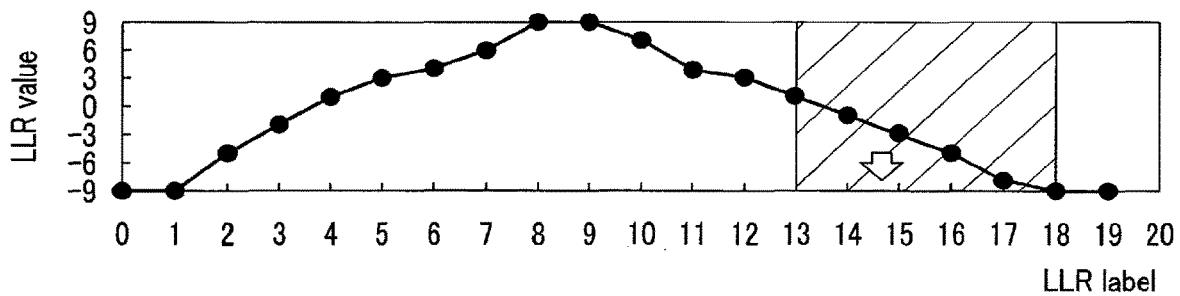
FIG. 17 shows the second example of LLR table corrections according to the second embodiment.

Referring back to FIG. 14, the memory controller 2 executes the operations at Steps S22 and S23. Steps S22 and S23 are the same as Steps S13 and S14, respectively. If the SB-use decoding is successful (Yes at Step S23), the processing flow is completed. If the SB-use decoding fails (No at Step S23), the processing flow proceeds to Step S25. In a manner similar to Step S21, the overall controller 27 corrects, at Step S25, the LLR value for an LLR label in the negative direction with respect to the corresponding LLR value in the initial LLR table. The LLR labels that are converted to the corrected LLR values correspond to the threshold voltages in the vicinity of the boundary between the D-state distribution and E-state distribution. When the conversion is based on the LLR table of FIG. 10, the LLR values for the LLR labels 13, 14, 15, 16, 17, and 18 will be corrected as indicated in FIG. 17. The correction has a magnitude of, for example, 1.

Figure 18:
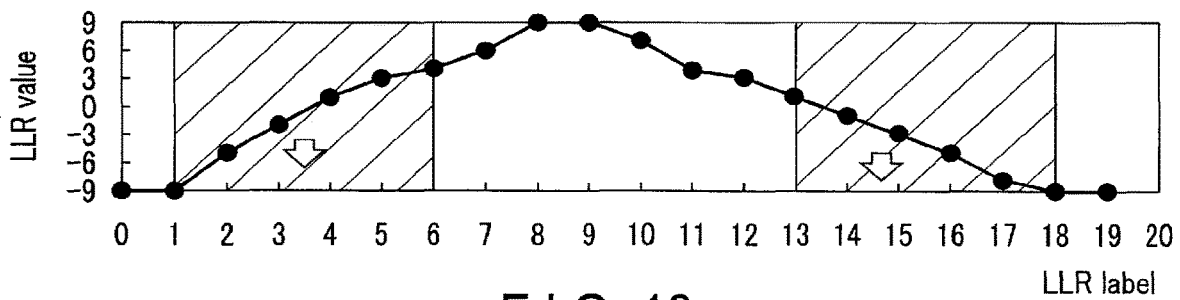
FIG. 18 shows the third example of LLR table corrections according to the second embodiment.

Referring back to FIG. 15, the memory controller 2 executes the operations at Steps S27 and S28. Steps S27 and S28 are the same as Steps S13 and S14, respectively. If the SB-use decoding is successful (Yes at Step S28), the processing flow is completed. If the SB-use decoding fails (No at Step S28), the processing flow proceeds to Step S31. In a manner similar to Step S21, the overall controller 27 corrects, at Step S31, the LLR value for an LLR label in the negative direction with respect to the corresponding LLR value in the initial LLR table. The LLR labels that are converted to the corrected LLR values correspond to the threshold voltages in the vicinity of the boundary between the Er-state distribution and the A-state distribution in a manner similar to Step S21, and to the threshold voltages in the vicinity of the boundary between the D-state distribution and the E-state distribution in a manner similar to Step S25. When the conversion is based on the LLR table of FIG. 10, the LLR values for LLR labels 1, 2, 3, 4, 5, 6, 13, 14, 15, 16, 17, and 18 will be corrected as indicated in FIG. 18. The correction has a magnitude of, for example, 1.

Figure 19:
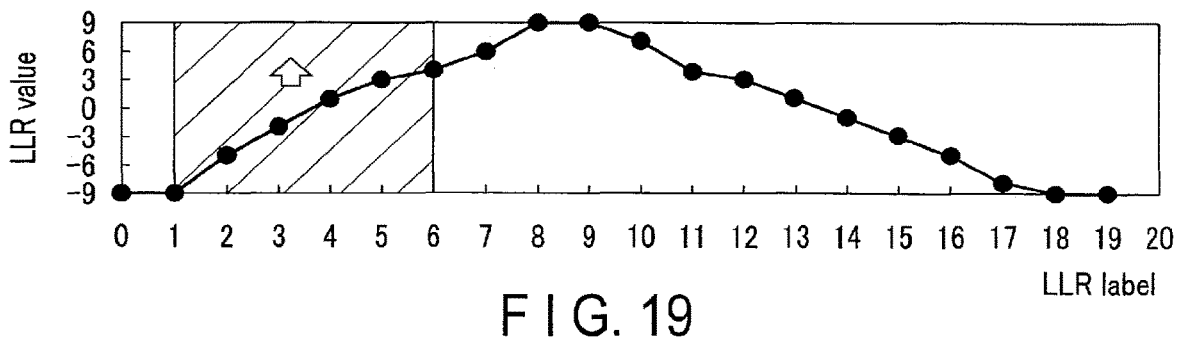
FIG. 19 shows the fourth example of LLR table corrections according to the second embodiment.

Referring back to FIG. 15, the memory controller 2 executes the operations at Steps S32 and S33. Steps S32 and S33 are the same as Steps S13 and S14, respectively. If the SB-use decoding is successful (Yes at Step S33), the processing flow is completed. If the SB-use decoding fails (No at Step S33), the processing flow proceeds to Step S35. In a manner similar to Step S21, the overall controller 27 corrects, at Step S35, the LLR value for an LLR label in the positive direction with respect to the corresponding LLR value in the initial LLR table. The LLR labels that are converted to the corrected LLR values correspond to the threshold voltages in the vicinity of the boundary between the Er-state distribution and A-state distribution. When the conversion is based on the LLR table of FIG. 10, the LLR values for LLR labels 1, 2, 3, 4, 5, and 6 will be corrected as indicated in FIG. 19. The correction has a magnitude of, for example, 1.

Figure 20:
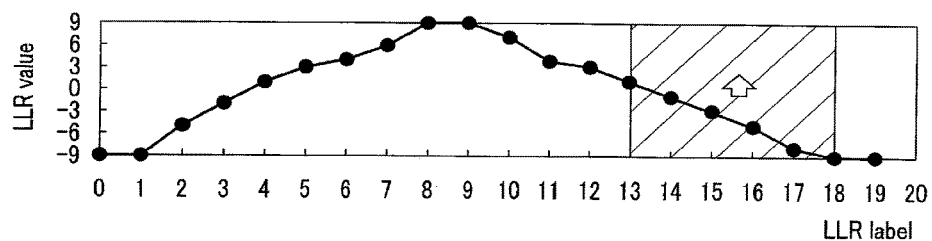
FIG. 20 shows the fifth example of LLR table corrections according to the second embodiment.

Referring back to FIG. 15, the memory controller 2 executes the operations at Steps S37 and S38. Steps S37 and S38 are the same as Steps S13 and S14, respectively. If the SB-use decoding is successful (Yes at Step S38), the processing flow is completed. If the SB-use decoding fails (No at Step S38), the processing flow proceeds to Step S41. In a manner similar to Step S21, the overall controller 27 corrects, at Step S41, the LLR value for an LLR label in the positive direction with respect to the corresponding LLR value in the initial LLR table. The LLR labels that are converted to the corrected LLR values correspond to the threshold voltages in the vicinity of the boundary between the D-state distribution and E-state distribution. When the conversion is based on the LLR table of FIG. 10, the LLR values for LLR labels 13, 14, 15, 16, 17, and 18 will be corrected as indicated in FIG. 20. The correction has a magnitude of, for example, 1.

Returning to FIG. 15, the memory controller 2 executes the operation at Step S43. Step S43 is the same as Step S13. If the SB-use decoding is successful (Yes at Step S43), the processing flow is completed. If the SB-use decoding fails (No at Step S43), the processing flow proceeds to Step S45. At Step S45, the memory controller 2 determines that the read operation has failed, as a result of which the processing flow in FIGS. 14 and 15 is completed. Thereafter, the memory controller 2 may notify the host device 3 of the failed read operation, and/or may attempt data decoding by performing a different error correction.

The order of correcting the LLR table in the example of FIGS. 14 and 15 is determined based on the order in which the SB-use decoding is likely to be successful. The correction of the LLR table, however, may be performed in an order different from the order indicated in FIGS. 14 and 15. With No at Step S43, the process may proceed to a combined step of Steps S35 and S41.

The above description has been given with reference to an example of reading data from the lower page. The second embodiment, however, is not limited to the above example, and may be applied to the data reading from the middle page and/or upper page.

Similarly to the first embodiment, the memory controller 2 according to the second embodiment is configured to re-convert an LLR label to an LLR value using an LLR table different from the LLR table used for the conversion of the LLR value in the failed SB-use decoding if the SB-use decoding fails. Thus, the second embodiment offers the same advantageous features as in the first embodiment.

In addition, the order of correcting the LLR table according to the second embodiment is determined based on the order in which the SB-use decoding is likely to be successful. For this reason, the decoding according to the second embodiment is likely to achieve the successful decoding in a shorter length of time than in the example in which the conversion method is changed in an order that is determined without taking into consideration the likelihood of successful decoding.

Embodiment 3

The third embodiment is based on the first or second embodiment, and the decoding result of the first or second embodiment is used in the third embodiment.

Figure 21:
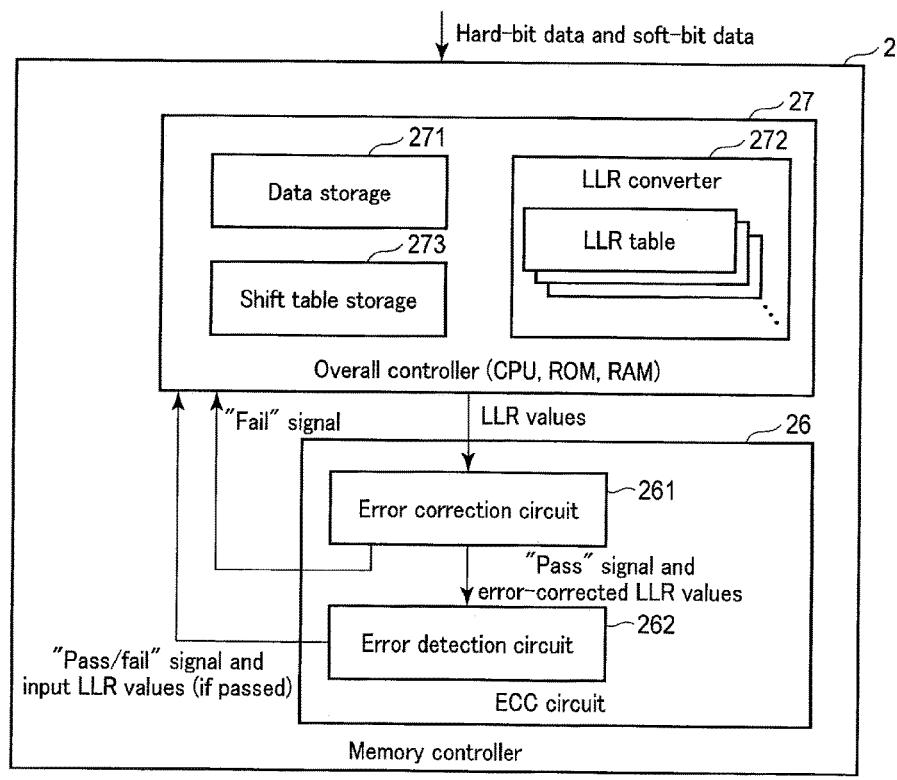
FIG. 21 is a functional block diagram showing components and connections of an ECC circuit according to the second embodiment, and components of a memory controller that are related to the ECC circuit.

The memory system 5 according to the third embodiment includes the same components and connections as those of the memory system 5 according to the first embodiment. The memory controller 2 according to the third embodiment is configured to execute the operations described below. In particular, the memory controller 2 is configured so that the firmware of the ROM 24 causes the memory controller 2 to execute the operations described below. In addition, according to the third embodiment, the overall controller 27 further includes a shift table storage 273, as illustrated in FIG. 21. The shift table storage 273 may be realized by part of the function of the RAM 23, and is configured to store shift tables. A shift table stores a magnitude of shift (shift value) for a local smallest voltage that has been estimated by Vth tracking. The shift table stores the shift value for each word line WL, or for a plurality of word lines having consecutive addresses. The shift table will be discussed later in detail.

Figure 22:
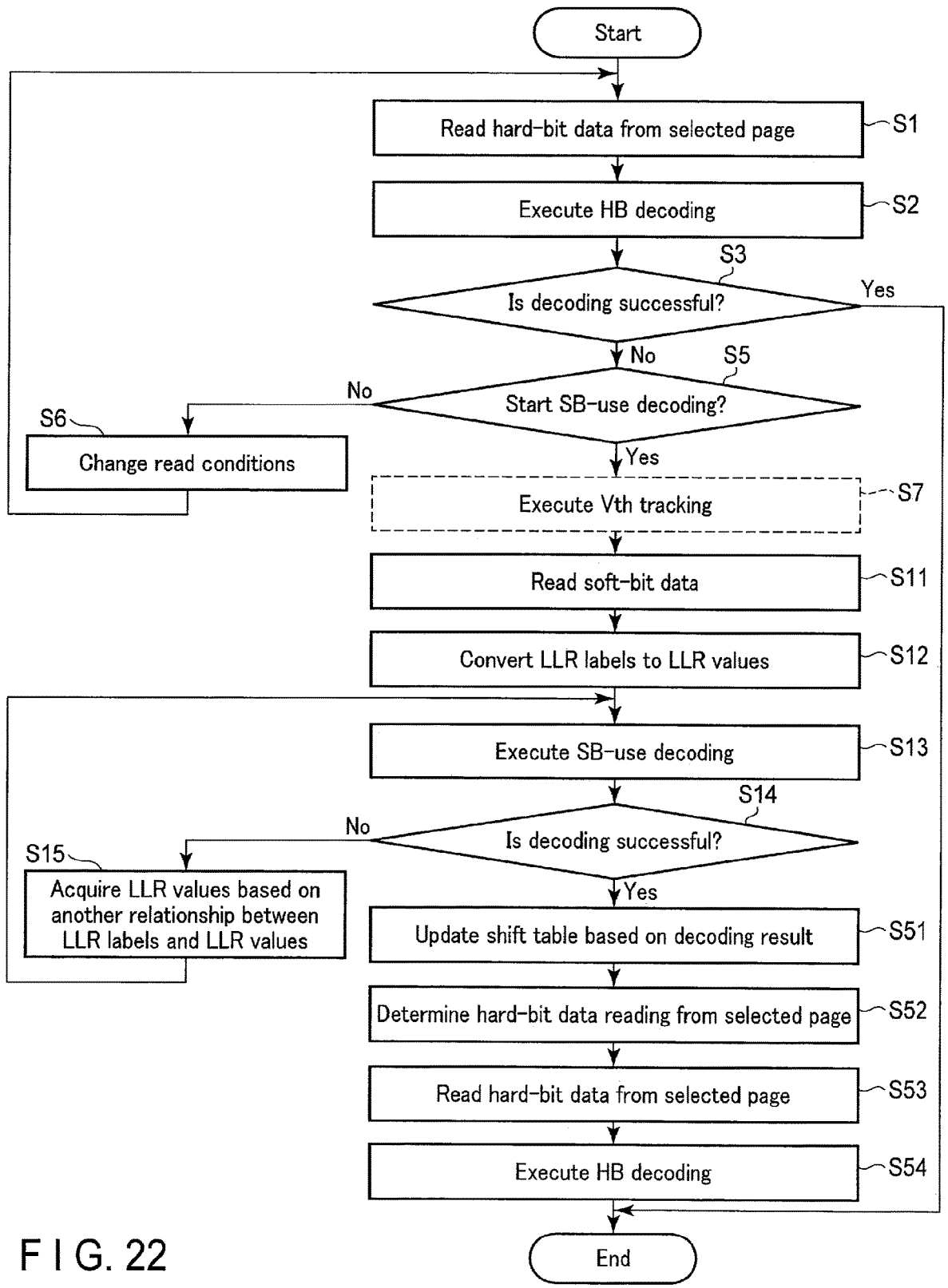
FIG. 22 is a flowchart of part of the operation of a memory system according to a third embodiment.

FIG. 22 shows a flow of part of the operation of the memory system 5 according to the third embodiment. This flow indicates part of the operation for reading the data twice from a page by the memory system 5. Some part of the processing flow of FIG. 22 is simplified to avoid any unnecessary complication of the description. FIG. 22 shows an example processing flow of the third embodiment combined with the first embodiment. The third embodiment may also be combined with the second embodiment.

As shown in FIG. 22, in a similar manner to the first embodiment, the memory controller 2 executes the operations at Steps S1, S2, S3, S5, S6, S7, S11, S12, S13, and S14 in FIG. 7. When the SB-use decoding is successful (Yes at Step S14), the processing flow proceeds to Step S51. At Step S51, based on the result of the successful SB-use decoding, the overall controller 27 updates the shift value for a word line WL that offers memory space for a selected page in the shift table. The operation at Step S51 will be discussed later in detail.

At Step S52, the memory controller 2 determines to read data from the same page as the selected page for the targeted reading at Step S1. At Step S53, the memory controller 2 acquires a shift value for the selected page by referring to the shift table. In particular, when determining that hard-bit data should be read from a page, the memory controller 2 determines whether or not the shift table stores a shift value for the word line WL of the cell unit CU that offers memory space for this page. If the shift value is stored, the memory controller 2 determines the use of the stored shift value.

At Step S53, the memory controller 2 instructs the memory device 1 to read hard-bit data from the selected page using the acquired shift value, and receives the instructed hard-bit data.

At Step S54, the memory controller 2 attempts the HB decoding of the received hard-bit data. Step S54 is the same as Step S2. In the example of FIG. 22, it is assumed that the HB decoding is successful. When Step S54 is completed, the processing flow is ended. In case the decoding at Step S54 fails, the processing flow may proceed to Step S3.

Figure 23:
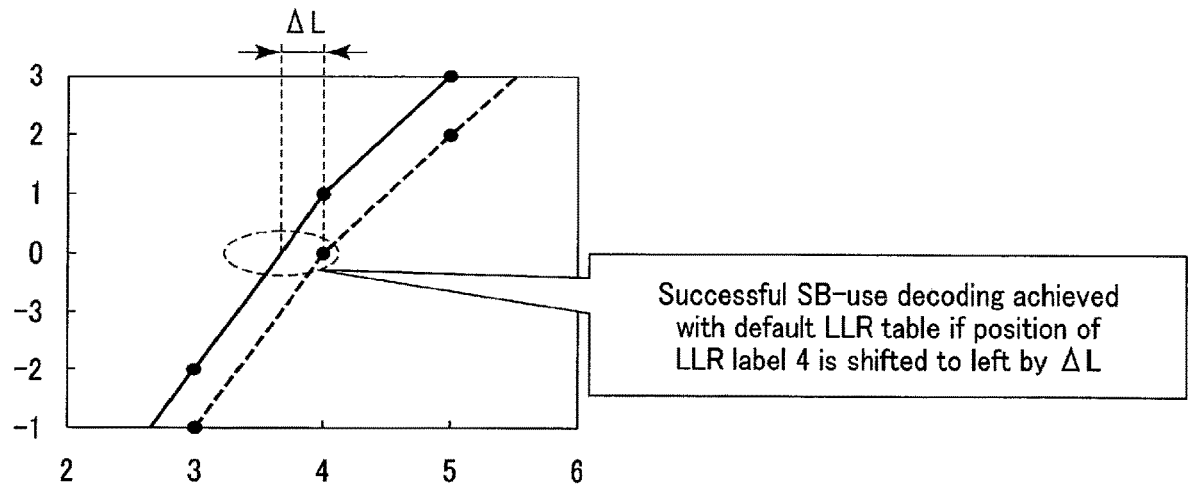
FIG. 23 shows part of the correspondence between two LLR tables according to the third embodiment.

The shift table and Step S51 will be described with reference to FIG. 23. The chart of FIG. 23 represents part of two LLR tables. The solid line denotes part of the middle LLR table in FIG. 10, which is the default LLR table that has been prepared in advance. The broken line denotes part of the bottom LLR table in FIG. 10. In the following description, it is assumed that the SB-use decoding of Step S14 is successful, by use of the LLR value converted in accordance with the bottom LLR table of FIG. 6 as represented by the broken line in FIG. 23. If the LLR label with the LLR value being at zero is focused on in FIG. 23, such an LLR label in the default LLR table falls between 3 and 4, at around 3.6. On the other hand, the LLR table with which the successful SB-use decoding is achieved converts the LLR label 4 to the LLR value 0. In view of the above, if the selected cell transistor MT determined as having the LLR label 4 based on the reading with the local smallest voltage estimated by the Vth tracking is determined as having the LLR label at around 3.6, the SB-use decoding using the default LLR table can be considered as successful. The reason that the data that resulted in the LLR label 4 has been read by the selected transistor MT determined as having the LLR label 4 by data reading with the local smallest voltage is because the adopted local smallest voltage was not an optimal one. In other words, the estimated local smallest voltage was not an optimal read voltage VAopt (with the minimal number of errors).

Figure 24:
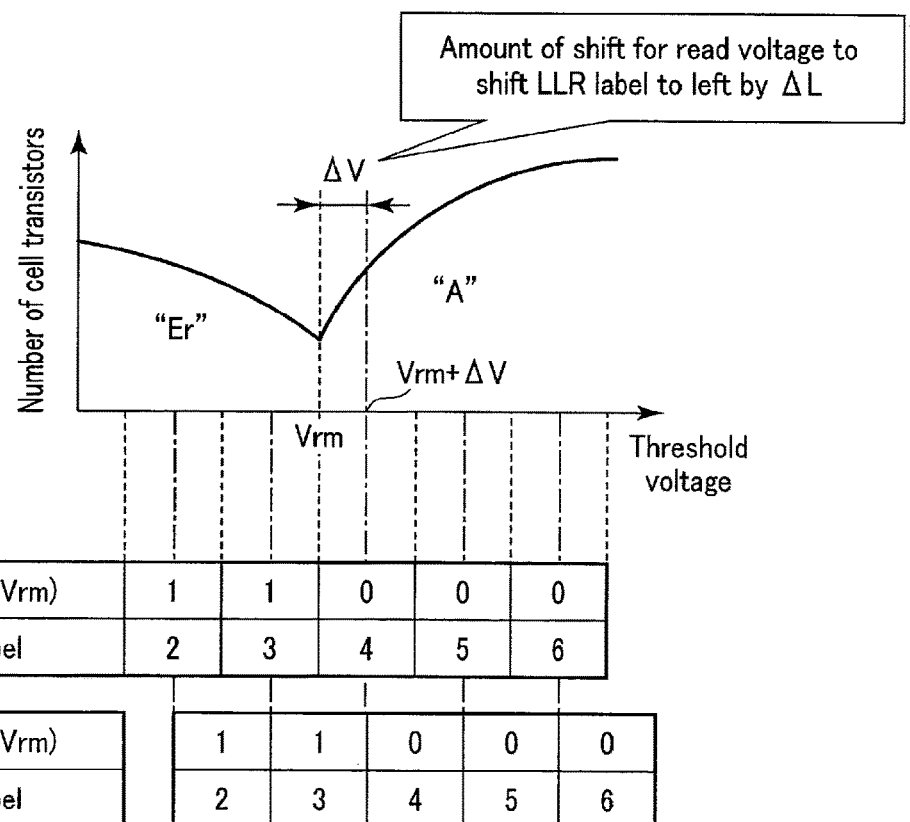
FIG. 24 shows LLR labels with two read voltages applied according to the third embodiment.

Based on the above, the overall controller 27 updates, at step S51, the shift value for the associated local smallest value in the shift table, based on the results of the SB-use decoding. As indicated in FIG. 24, the reading with the voltage Vrm+ΔV in place of the local smallest voltage Vrm will lead to the acquisition of the hard-bit data containing fewer errors. The difference between the LLR label N (where N is 0 or any natural number) and the LLR label N+1 is known, and, as discussed above, the difference is equal to an integral multiple of the predetermined to-be-increased or to-be-decreased amount of the read voltage VCGR that can be instructed to the memory device 1. For this reason, the overall controller 27 is configured to calculate the value ΔV. For example, ΔV may be approximately 3DAC. As described above, the overall controller 27 stores the local smallest voltage Vrm, which is estimated during the operation of reading data from the cell unit CU of a selected word line WL, and uses as a read voltage VCGR the local smallest voltage Vrm stored in the operation of reading the next data from the selected cell unit CU of the word line WL. The overall controller 27 thereby updates, at Step S51, the local smallest voltage Vrm for the word line (selected word line) WL of the selected cell unit CU, to Vrm+ΔV.

The overall controller 27 uses the local smallest voltage Vrm+ΔV as a read voltage when reading data from the selected page at Step S53. As a result, some of the cell transistors MT that have been determined as having data "0" in the reading with the local smallest voltage Vrm are determined as having data "1". It should be noted that the hard-bit data differs in the use of the local smallest voltage Vrm and in the use of the voltage Vrm+ΔV, and that the LLR label boundary also differs. The hard-bit data acquired by using the voltage Vrm+ΔV is likely to contain fewer errors than the hard-bit data acquired by using the local smallest voltage Vrm. This means that the error correction is likely to be successful based on the HB decoding only.

FIG. 25 shows an example of a shift table according to the third embodiment. The overall controller 27 may store seven local smallest voltages Vrm1 to Vrm7 for each word line WL, or for each group of word lines WL having consecutive addresses. The local smallest voltages Vrm1 to Vrm7 for a certain word line WL are used as read voltages VA to VG when reading from the cell unit CU of this word line WL. The shift table stores a shift amount ΔV for each word line WL or for each group of word lines WL assigned with the same set of local smallest voltages Vrm1 to Vrm7. Alternatively, a specific shift amount may be used for each of the local smallest voltages Vrm1 to Vrm7.

The third embodiment may be combined with the second embodiment. If this is the case, the process proceeds to Step S51 when "Yes" is selected at any of Steps S23, S28, S33, S38, and S43.

According to the third embodiment, the memory controller 2 requires a shorter period of time to acquire correct data, as discussed below. The local smallest voltage estimated during the data reading from a cell unit CU is stored in the memory controller 2 so that it can be used for the next reading from this cell unit CU. Alternatively, the local smallest voltage can be estimated for each data reading, whether or not the data reading is from the same cell unit CU. In either case, the HB decoding would not be successful if there is a significant gap between the local smallest voltage and the minimum FBC voltage, which means that the SB-use decoding needs to be conducted. Then, the SB-use decoding may need to be conducted every time for the data reading from a cell unit CU, which would require a long period of time for data reading.

According to the third embodiment, when the SB-use decoding is successful by use of the LLR values that are re-acquired based on an LLR table that is different from the initial LLR table, the memory controller 2 calculates a shift amount for shifting the estimated local smallest voltage based on the LLR table that has resulted in the successful SB-use decoding, and stores this shift amount. In the next data reading, the memory controller 2 uses the sum of the stored shift amount and the corresponding local smallest voltage. The sum of the local smallest voltage and the shift amount provides a more suitable read voltage. As a result, the hard-bit data acquired using the sum of the local smallest voltage and the shift amount is likely to contain fewer errors than the hard-bit data acquired using the initial local smallest voltage as the read voltage. The use of, as a read voltage, the local smallest voltage to which the shift amount is added can increase the possibility of acquiring the correct data based on the HB decoding only, while reducing the need to conduct the SB-use decoding. This allows for the acquisition of correct data in a shorter period of time.

Embodiment 4

The fourth embodiment relates to a method of selecting more suitable one of LLR tables.

The memory system 5 according to the fourth embodiment includes the same components and connections as those of the memory system 5 according to the first embodiment. The memory controller 2 according to the fourth embodiment is configured to execute the operations described below. In particular, the memory controller 2 is configured so that the firmware of the ROM 24 causes the memory controller 2 to execute the operations described below.

FIG. 26 shows the components and connections of an ECC circuit 26 according to the fourth embodiment, and the functional blocks related to the ECC circuit 26 in the memory controller 2. As illustrated in FIG. 26, the overall controller 27 further includes an adder 275 and an LLR table selector 276. The adder 275 receives a plurality of syndrome values, calculates the sum of the received syndrome values, and supplies the calculated sum to the LLR table selector 276. Based on the received sum, the LLR table selector 276 selects one of a plurality of LLR tables. The overall controller 27 may cause the ECC circuit 26 to operate in a selected one of an LLR table selection mode and decode mode. In the decode mode, the ECC circuit 26 executes error correction to data. In the LLR table selection mode, which precedes the decode mode, the ECC circuit 26 selects, from a plurality of LLR tables, an LLR table that is to be used in a subsequent decode mode.

The error correction circuit 261 may execute LDPC decoding by use of the syndrome values. The error correction circuit 261 includes a syndrome check circuit 2611, a decoding circuit 2612, and a syndrome check circuit 2613.

The syndrome check circuit 2611 has an m×n check matrix (where n and m are natural numbers). The syndrome check circuit 2611 may receive a plurality of LLR values as an input, derive a plurality of respective hard-decision values from the LLR values, and calculate syndrome values from the hard-decision values and the check matrix.

Specifically, the syndrome check circuit 2611 calculates a product of n LLR values LLR1 to LLRn (1×n matrix of LLR values) and the transposed matrix of the m×n check matrix to acquire m syndrome values S1 to Sm. The syndrome check circuit 2611 is configured to calculate the syndrome values S1 to Sm by parallel processing executed onto the LLR values LLR1 to LLRn. Each of the syndrome values S1 to Sm is one-bit data, and is supplied to the adder 275.

The syndrome check circuit 2611 is further configured to determine as to whether the set of LLR values input to the syndrome check circuit 2611 is "passed" or "failed" in the decode mode, based on the calculated syndrome value. In the case of a "pass", it is considered that the input LLR values do not contain any errors. The syndrome check circuit 2611 supplies to the error detection circuit 262 a signal notifying of the "pass" determination and the input set of LLR values. In the case of a "fail", the syndrome check circuit 2611 supplies a signal notifying of the "fail" determination and the input set of LLR values to the decoding circuit 2612.

In response to the input of the signal notifying of the "fail" determination and the set of LLR values, the decoding circuit 2612 executes the SB-use decoding using the input set of LLR values, and supplies the error-corrected set of LLR values to the syndrome check circuit 2613.

Similarly to the syndrome check circuit 2611, the syndrome check circuit 2613 includes an m×n check matrix. The syndrome check circuit 2613 receives a plurality of LLR values as an input, derives a plurality of respective hard-decision values from the corresponding LLR values, and calculates syndrome values from the hard-decision values and the transposed matrix of the check matrix. Upon receipt of the error-corrected set of LLR values, the syndrome check circuit 2613 calculates m syndrome values in a similar manner to the syndrome check circuit 2611. The syndrome check circuit 2613 determines as to whether the error-corrected set of LLR values is "passed" or "failed", based on the calculated syndrome values. If the determination is "pass", the syndrome check circuit 2613 supplies to the error detection circuit 262 a signal notifying of the "pass" determination and the error-corrected set of LLR values. If the determination is "fail", the syndrome check circuit 2613 supplies to the error detection circuit 262 a signal notifying of the "fail" determination and the set of LLR values received from the syndrome check circuit 2613.

In response to the input of the signal notifying of "pass" and the set of LLR values (i.e., the error-corrected set of LLR values), the error detection circuit 262 checks if the input set of LLR values contains any errors. If any error is contained, the signal indicative of the "fail" determination is supplied to the overall controller 27. If no error is contained, the error detection circuit 262 determines that the error correction made by the error correction circuit 261 appears probable, supplies the signal indicative of the "pass" determination to the overall controller 27, and supplies the input (i.e., error-corrected) set of LLR values to the overall controller 27 (the RAM 23 in particular).

The syndrome check circuit 2613 may be incorporated in the syndrome check circuit 2611 so that the syndrome check circuit 2611 executes the processing described above as being executed by the syndrome check circuit 2613.

FIG. 27 is a detailed block diagram illustrating the syndrome check circuit 2611 and part of the overall controller 27 according to the fourth embodiment. In this diagram, the syndrome check circuit 2611 and part of the overall controller 27 that relate to the operation of the LLR table selection mode are illustrated.

As shown in FIG. 27, the LLR converter 272 includes a first component 272a and a second component 272b. Hereinafter, the first component 272a and the second component 272b are referred to as an LLR converter 272a and LLR converter 272b, respectively. The LLR converters 272a and 272b are configured to operate in parallel. Each of the LLR converters 272a and 272b is realized by part of the function of the LLR converter 272. When the LLR converter 272 operates, the LLR converters 272a and 272b operate in parallel. The LLR converters 272a and 272b both receive n LLR labels LLRl1 to LLRln. The LLR converter 272a converts the LLR labels LLRl1 to LLRln to n LLR values LLRva1 to LLRvan, respectively, using an LLR table 2721a. The LLR converter 272b converts the LLR labels LLRl1 to LLRln to n LLR values LLRvb1 to LLRvbn, respectively, using an LLR table 2721b. The LLR tables 2721a and 2721b are different from each other, converting the same LLR label to different LLR values.

The syndrome check circuit 2611 includes a first component 2611a and a second component 2611b. Hereinafter, the first component 2611a and the second component 2611b are referred to as a syndrome check circuit 2611a and a syndrome check circuit 2611b, respectively. These syndrome check circuits 2611a and 2611b are configured to operate in parallel. That is, the syndrome check circuits 2611a and 2611b are realized by part of the function of the syndrome check circuit 2611. When the syndrome check circuit 2611 operates, the syndrome check circuits 2611a and 2611b operate in parallel.

The syndrome check circuit 2611a receives the LLR values LLRva1 to LLRvan, and calculates a product of a 1×n matrix containing n respective hard-decision values of the LLR values LLRva1 to LLRvan and the transposed matrix of a k×n check matrix to acquire k syndrome values Sa1 to Sak.

The syndrome check circuit 2611b receives LLR values LLRvb1 to LLRvbn, and calculates a product of a 1×n matrix containing n respective hard-decision values of the LLR values LLRvb1 to LLRvbn and the transposed matrix of a (m−k)×n check matrix to acquire m−k syndrome values Sb1 to Sb(m−k).

The adder 275 includes an adder 275a and adder 275b. The adder 275a receives the syndrome values Sa1 to Sak, adds the syndrome values Sa1 to Sak up to acquire the total sum Ta. The total sum Ta is data of multiple bits. The adder 275b receives the syndrome values Sb1 to Sb(m−k), and adds the syndrome values Sb1 to Sb(m−k) into the total sum Tb. The total sum Tb is data of multiple bits.

The total sums Ta and Tb are supplied to the LLR table selector 276. The LLR table selector 276 compares the total sums Ta and Tb to find which is larger. The LLR table selector 276 may multiply the total sum Ta and/or Tb by a weight and compare the weighted total sum Ta and Tb. Based on the comparative determination, the LLR table selector 276 selects the LLR table 2721a or 2721b. The LLR table selector 276 selects the LLR table 2721a if the total sum Ta is smaller, and selects the LLR table 2721b if the total sum Tb is smaller.

The overall controller 27 controls the ECC circuit 26 so that the ECC circuit 26 executes the SB-use decoding in the decode mode by use of the LLR table 2721a or 2721b that has been selected in the LLR table selection mode prior to the decode mode.

Figure 28:
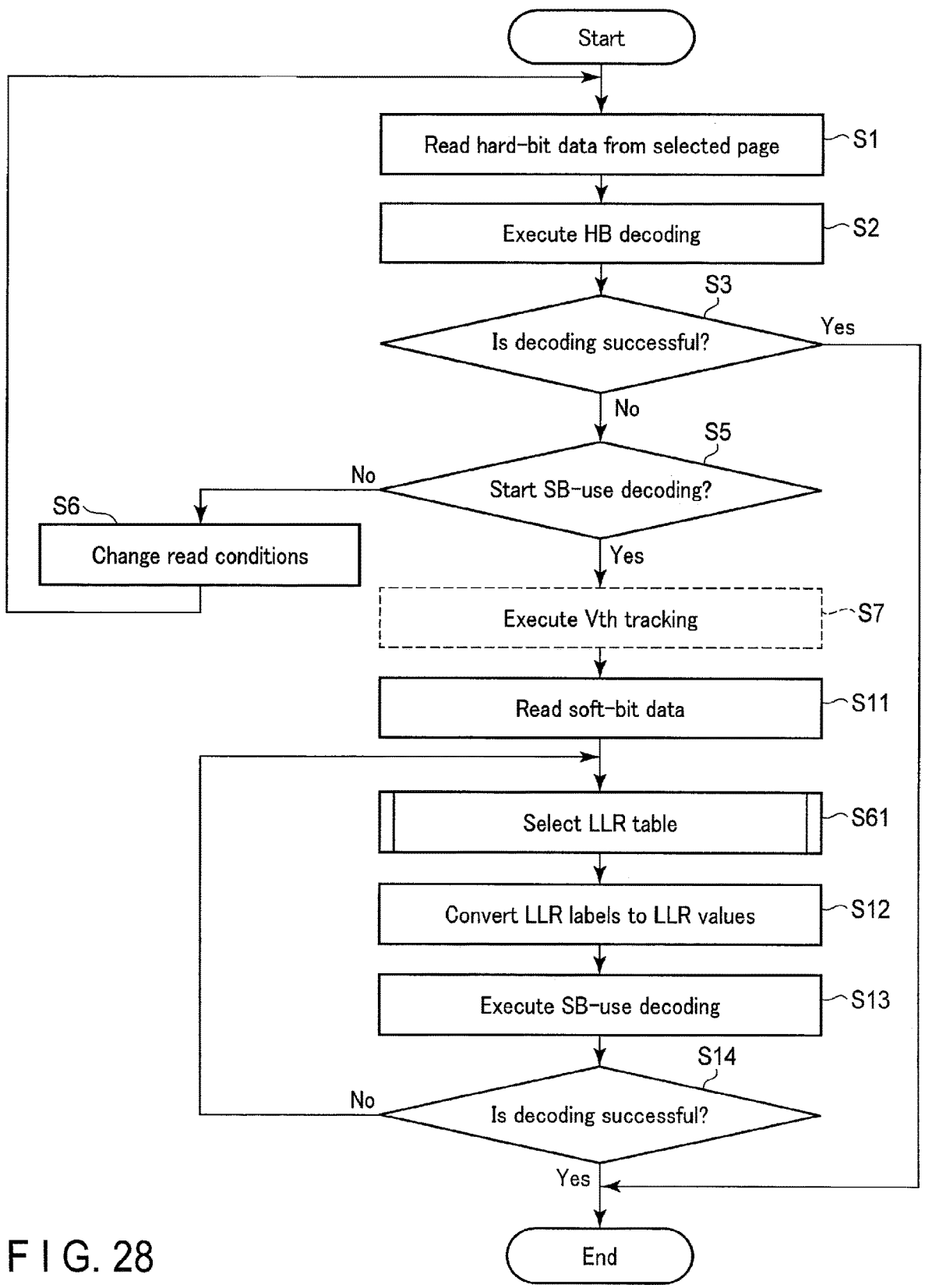
FIG. 28 is a flowchart of part of the operation of a memory system according to the fourth embodiment.

FIG. 28 is a flowchart of part of the operation of a memory controller 2 according to the fourth embodiment. The fourth embodiment may be combined with any of the first to third embodiments. The illustration of FIG. 28 as well as the following description relates to an example of the fourth embodiment combined with the first embodiment. As shown in FIG. 28, Step S61 is inserted between Step S11 and Step S12. When the SB-use decoding is initiated, Steps S7 and S11 are executed, and thereafter Step S61 is executed. The operation at Step S61 is to estimate, prior to the actual SB-use decoding, which of the two LLR tables 2721a and 2721b that have been selected by a criterion is more suitable, or in other words, which of these tables results in better SB-use decoding. Step S61 proceeds to Step S12. Furthermore, No branch at Step S14 continues to Step S61.

One LLR table that is likely to have the smallest total sum may be selected from three or more possible LLR tables by repeating the operation at Step S61, and thereafter the operation at Step S12 may be executed. If this is the case, by repeating Step S61, the selection of one of the two LLR tables is repeated.

FIG. 29 shows a sub-flow of Step S61. In FIG. 29, Step SS11 proceeds to Sub-steps SS611 and SS616. The operations at Sub-steps SS611, SS612, and SS613 are executed in parallel to the operations at Sub-steps SS616, SS617, and SS618.

At Sub-step SS611, the LLR converter 272a converts each of the n LLR labels to an LLR value, using the LLR table 2721a, and thereby acquires n LLR values. At Sub-step SS612, the syndrome check circuit 2611a calculates k syndrome values from the 1×n matrix of LLR values acquired at Sub-step SS611 and the transposed matrix of the k×n check matrix. At Sub-step SS613, the adder 275a adds the calculated syndrome values to the total sum Ta. Sub-step SS613 proceeds to Sub-step SS619.

At Sub-step SS616, the LLR converter 272b converts each of the n LLR labels to an LLR value, using the LLR table 2721b, and thereby obtains n LLR values. At Sub-step SS617, the syndrome check circuit 2611b calculates m−k syndrome values from the 1×n matrix of the LLR values acquired at Sub-step SS616, and the transposed matrix of the (m−k)×n check matrix. At Sub-step SS618, the adder 275b adds the calculated syndrome values to the total sum Tb. Sub-step S618 proceeds to Sub-step SS619.

At Sub-step SS619, the overall controller 27 selects the LLR table 2721a or 2721b, based on the comparison between the total sums Ta and Tb. Sub-step SS619 proceeds to Step S12. The decoding at Step S12 adopts the LLR table selected at Step S619.

Figure 30:
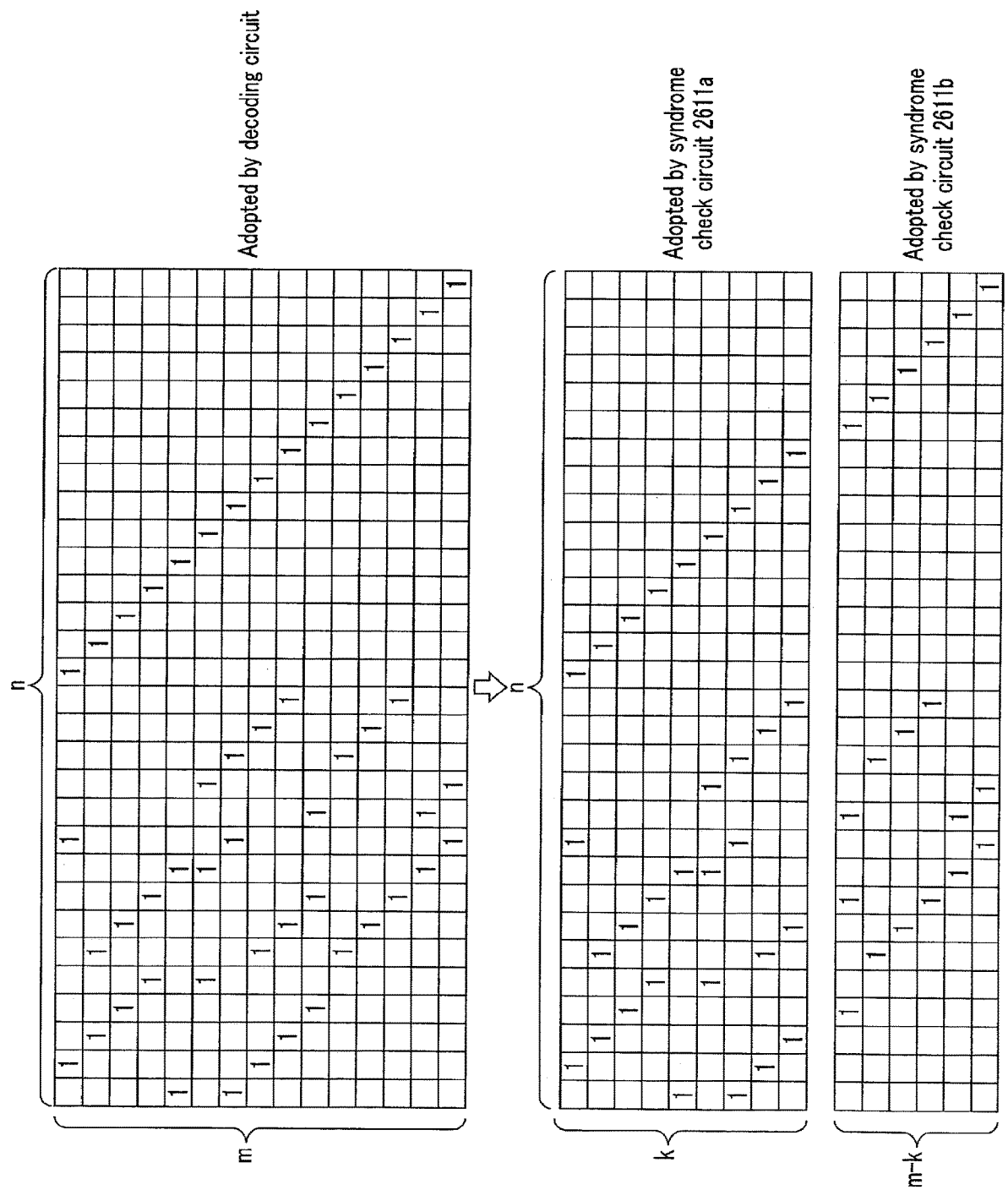
FIG. 30 shows examples of various check matrices according to the fourth embodiment.

FIG. 30 shows examples of various check matrices according to the fourth embodiment. In FIG. 30, the top matrix is an m×n check matrix used by the decoding circuit 2612 in the decode mode. On the other hand, in the LLR table selection mode, the middle and bottom check matrices are used. In particular, the middle matrix is an example of the check matrix used by the syndrome check circuit 2611a, while the bottom matrix is an example of the check matrix used by the syndrome check circuit 2611b.

The middle check matrix of FIG. 30 is a submatrix of the m×n check matrix (hereinafter referred to as a "decode check matrix") used by the decoding circuit 2612. This submatrix contains k rows of the decode check matrix, having k×n elements. The k rows can be any rows in the decode check matrix. In the illustrated example, the submatrix contains the first to $k^{th}$ rows of the decode check matrix.

The bottom check matrix is also a submatrix of the decode check matrix. This submatrix contains m−k rows of the decode check matrix, having (m−k)×n elements. The m−k rows may be any rows of the decode check matrix. For example, from the aspects of preventing the circuitry of the ECC circuit 26 from becoming complex and enhancing the efficiency of the use of the RAM in the ECC circuit 26, the m−k rows may be determined so as not to overlap with the rows of the middle check matrix of the decode check matrix. FIG. 30 illustrates such a configuration, in which the bottom check matrix contains the $(k+1)^{th}$ to $m^{th}$ rows of the decode check matrix.

As discussed above, a submatrix having any k rows and a submatrix having m−k rows may be formed from a decode check matrix. In case the number of "1"s in the k rows does not agree with the number of "1"s in the m−k rows, the total sums Ta and Tb are weighted at Sub-step SS613. That is, when the number of "1"s in the k rows is N, while the number of "1"s in the m−k rows is M, the total sum Tb is multiplied by N/M so that the total sum Ta is compared with the total sum Tb×(N/M).

According to the fourth embodiment, a more suitable one of the two LLR tables can be selected in a shorter period of time, as discussed below.

In order to select a more suitable one of two LLR tables, an m×n decode check matrix may be adopted. That is, n LLR labels are converted to a first set of LLR values based on one of the LLR tables, and the total sum is calculated from the first set of LLR values and the transposed matrix of the decode check matrix. Similarly, the n LLR labels are converted to a second set of LLR values based on the other LLR table, and the total sum is calculated from the second set of LLR values and the transposed matrix of the decode check matrix. Thereafter, the two total sums are compared. With such a method, however, the syndrome values will have to be calculated twice based on the m×n decode check matrix, which means that 2m syndrome values in total will need to be calculated. The calculation of more syndrome values will require a longer period of time for the calculation of the syndrome values.

The memory controller 2 according to the fourth embodiment is configured to form a k×n submatrix and a (m−k)×n submatrix from the m×n decode check matrix, calculate syndrome values based on these submatrices, and select an LLR table estimated as the most suitable table from a plurality of LLR tables based on the calculated syndrome values. The number of syndrome values that are to be calculated is k+(m−k)=m. The calculation amount of the syndrome values therefore can be smaller than the calculation amount for 2 m syndrome values calculated based on the decode check matrix, and the calculation of the necessary syndrome values can be obtained in a shorter period of time. In this manner, a more suitable LLR table can be selected from the two LLR tables in a shorter period of time than in the selection using the original decode matrix.

Furthermore, evaluations of the LLR tables are performed while using the syndrome values. Thus, prior to obtaining the decoding result with the LLRs that are obtained based on an LLR table, the LLR table that has been used may be evaluated, or in other words, this table may be compared with other LLR tables. In this manner, the re-selection of an LLR table can be performed in a shorter period of time than the re-selection of an LLR table based on the result of decoding. The successful decoding adopting such a re-selection requires a shorter length of time than the successful decoding adopting the re-selection of an LLR table based on the decoding result.

Embodiment 5

The fifth embodiment is based on the fourth embodiment, and relates to an example of the selection from three or more LLR tables and formation of selection check matrices.

The memory system 5 according to the fifth embodiment includes the same components and connections as those of the memory system 5 according to the first embodiment. The memory controller 2 according to the fifth embodiment includes the same components and connections as the memory controller 2 according to the fourth embodiment, and is configured to execute the operations that are described below. In particular, the firmware of the ROM 24 causes the memory controller 2 to execute such operations.

FIG. 31 is a detailed block diagram illustrating the syndrome check circuit 2611 and part of the overall controller 27 according to the fifth embodiment. In this diagram, the syndrome check circuit 2611 and part of the overall controller 27 that relate to the operation of the LLR table selection mode is illustrated.

As illustrated in FIG. 31, the LLR converter 272 includes LLR converters 272a, 272b, and 272c. The LLR converters 272a, 272b, and 272c may be operated in parallel, and are realized by part of the function of the LLR converter 272. In a manner similar to the LLR converter 272a (or 272b) according to the fourth embodiment, the LLR converters 272a, 272b, and 272c employ LLR tables 2721a, 2721b, and 2721c, respectively, to each convert the LLR labels LLRl1 to LLRln to n LLR values.

The syndrome check circuit 2611 includes syndrome check circuits 2611a, 2611b, and 2611c. The syndrome check circuits 2611a, 2611b, and 2611c may be operated in parallel, and are realized by part of the function of the syndrome check circuit 2611. The syndrome check circuits 2611a, 2611b, and 2611c each store an i×n check matrix, a j×n check matrix, and a (m−i−j)×n check matrix, where i and j are natural numbers smaller than or equal to m. In a manner similar to the syndrome check circuit 2611a (or 2611b) according to the fourth embodiment, the syndrome check circuit 2611a calculates the product of a 1×n matrix containing n respective hard-decision values of the n LLR values and the transposed matrix of an i×n check matrix to acquire i syndrome values Sa1 to Sai. In a manner similar to the syndrome check circuit 2611a (or 2611b) according to the fourth embodiment, the syndrome check circuit 2611b calculates the product of a 1×n matrix containing respective n hard-decision values of the n LLR values and the transposed matrix of a j×n check matrix to acquire j syndrome values Sb1 to Sbj. In a manner similar to the syndrome check circuit 2611a (or 2611b) according to the fourth embodiment, the syndrome check circuit 2611c calculates the product of a 1×n matrix containing n respective hard-decision values of the n LLR values and the transposed matrix of a (m−i−j)×n check matrix to acquire the number m−i−j of syndrome values Sc1 to Sc(m−i−j).

The adder 275 includes adders 275a, 275b, and 275c. The adder 275a adds the syndrome values Sa1 to Sai to the total sum Ta. The adder 275b adds the syndrome values Sb1 to Sbj to the total sum Tb. The adder 275c adds the syndrome values Sc1 to Sc(m−i−j) to the total sum Tc.

The LLR table selector 276 selects the smallest one of the total sums Ta, Tb, and Tc, and selects one of the LLR tables 2721a, 2121b, or 2721c that corresponds to the smallest one of the total sums Ta, Tb, and Tc.

Figure 32:
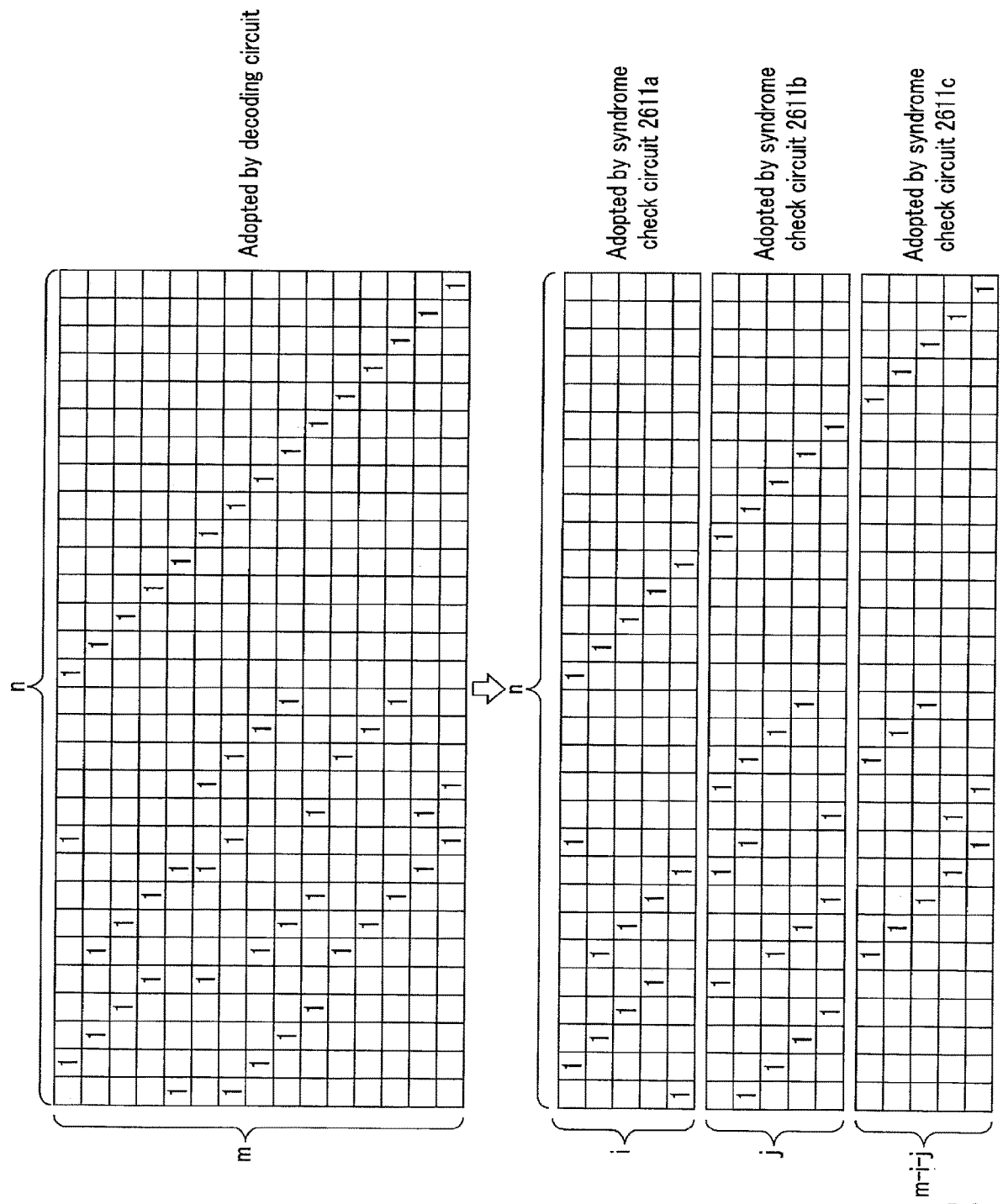
FIG. 32 shows examples of various check matrices according to the fifth embodiment.

FIG. 32 shows examples of various check matrices according to the fifth embodiment. In FIG. 32, the first, second, third, and fourth matrices from the top represent a m×n decode check matrix, i×n check matrix, j×n check matrix, and (m−i−j)×n check matrix, respectively. The i×n check matrix, j×n check matrix, and (m−i−j)×n check matrix are submatrices of the decode check matrix, and are used by the syndrome check circuits 2611a, 2611b, and 2611c, respectively. The i×n check matrix, j×n check matrix, and (m−i−j)×n check matrix may include any of the rows of the decode check matrix. In a manner similar to the fourth embodiment, each of the submatrices may include rows that do not overlap with the rows of other submatrices, from the aspects of preventing the circuitry of the ECC circuit 26 from becoming complex and enhancing the efficiency of the use of the RAM in the ECC circuit 26. Such an example is illustrated in FIG. 32, where the first check matrix contains the first to $i^{th}$ rows of the decode check matrix, the second check matrix contains the $(i+1)^{th}$ to $(i+j)^{th}$ rows, and the third check matrix contains the $(i+j+1)^{th}$ to $m^{th}$ rows.

Based on the expanded principles of the above description, the selection of the optimal LLR table from four or more LLR tables can also be achieved.

Next, an example of the formation of submatrices is described with reference to FIGS. 33 and 34. Both drawings show a decode check matrix and its submatrices. The submatrices of FIG. 33 may be used in the fifth embodiment, and the submatrices of FIG. 34 may be used in the fourth and fifth embodiments.

Figure 33:
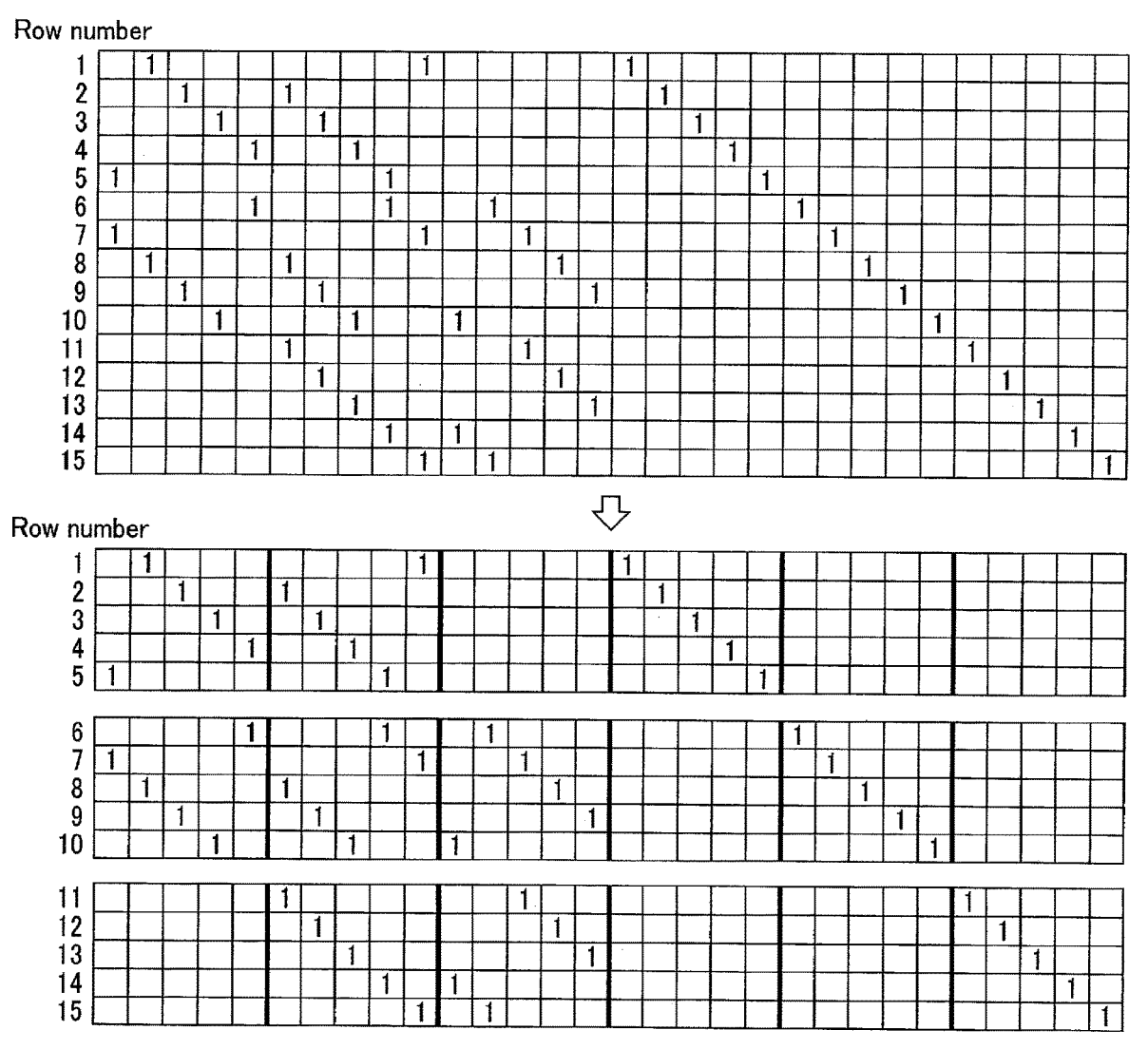

The example of FIG. 33 indicates that a group of the first to fifth rows, a group of the sixth to tenth rows, and a group of the eleventh to fifteenth rows of the first decode check matrix are adopted by different syndrome check circuits. The thick lines along the columns demarcate units of processing by the syndrome check circuits. A syndrome check circuit is configured to calculate syndrome values for a maximum processing unit or smaller. In the example of FIG. 33, syndrome values are to be calculated for every five columns, a set of which is smaller than the maximum unit of processing. In the example of this drawing, 5×5 submatrices are formed in each group of rows, as divided by the thick lines, so as to exhibit a relationship of circular matrices. In this example, with each submatrix containing consecutive rows, the control of the syndrome calculation can be facilitated.

Figures 34, 35:
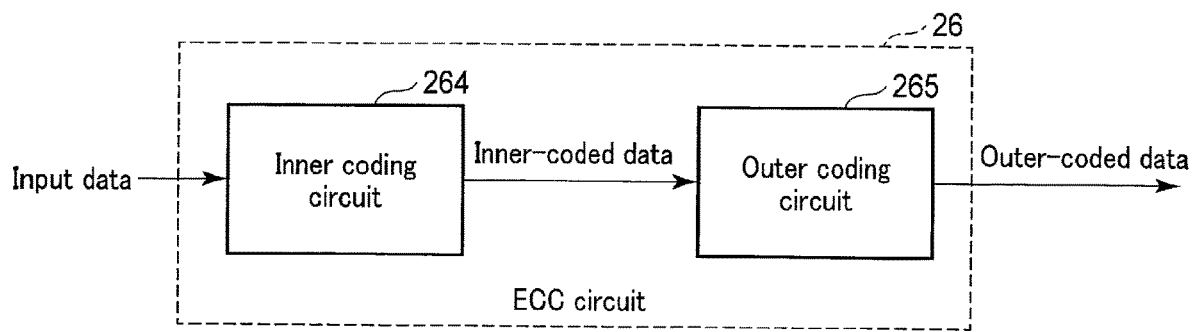
FIG. 34 shows another example of a decode check matrix and submatrices according to the fifth embodiment.
FIG. 35 shows the components of part of an ECC circuit according to a sixth embodiment.

In the example of FIG. 34, the submatrices are formed so that all of the units of processing contain the same number of non-zero elements (=1). To form such submatrices, the decode check matrix indicated at the top is divided into two submatrices, one containing the first to third and seventh to ninth rows, and the other containing the fourth to sixth and tenth to twelfth rows. These two submatrices are used by different syndrome check circuits. As mentioned above, since each of the submatrices is formed so that all the units of processing have the same number of non-zero elements (=1) in the example of FIG. 34, the column weights in all the columns (i.e., the number of non-zero elements in each column) agree with each other. For this reason, when comparing the total sums of syndrome values, a difference in column weights does not need to be taken into consideration.

According to the fifth embodiment, a plurality of submatrices are formed from a decode check matrix in a manner similar to the fourth embodiment. These submatrices are used for the calculation of syndrome values, and an estimated optimal LLR table is selected from a plurality of LLR tables based on the calculated syndrome values. Accordingly, the same advantageous feature as the fourth embodiment can be achieved. In addition, according to the fifth embodiment, three or more submatrices are formed from the decode check matrix and used in parallel to calculate syndrome values. In this manner, an estimated optimal LLR table can be selected from multiple LLR tables.

Embodiment 6

The sixth embodiment is based on the fourth embodiment, and demonstrates another method of selecting an LLR table.

The memory system 5 according to the sixth embodiment includes the same components and connections as those of the memory system 5 according to the first embodiment. The memory controller 2 according to the sixth embodiment includes the same components and connections as the memory controller 2 according to the fourth embodiment, and is configured to execute the operations that are described below. In particular, the firmware of the ROM 24 causes the memory controller 2 to execute such operations.

Furthermore, the ECC circuit 26 according to the sixth embodiment includes the components and connections as illustrated in FIG. 35. FIG. 35 shows the coding-related components of the ECC circuit 26 according to the sixth embodiment. As illustrated in this drawing, the ECC circuit 26 includes an inner coding circuit 264 and an outer coding circuit 265.

The inner coding circuit 264 generates parities for the error correction of the input data, such as sections of the substantial write data (substantial write data sections) that have been divided by the overall controller 27, and thereby generates inner-coded data. The inner-coded data includes the input data that is input to the inner coding circuit 264, and the parities. The inner coding circuit 264 generates inner coding parities in accordance with the error correction scheme adopted by this inner coding circuit 264, such as the BCH coding.

The outer coding circuit 265 receives a set of inner-coded data from the inner coding circuit 264, generates parities for the error correction of the inner-coded data, and thereby generates outer-coded data. The outer-coded data includes the set of inner-coded data and the parities. The outer coding circuit 265 executes coding in accordance with the error correction scheme adopted by the outer coding circuit 265, such as the LDPC coding.

FIG. 36 shows an example of the substantial write data, inner-coded data and outer-coded data according to the sixth embodiment. As illustrated in this drawing, the substantial write data is divided into multiple sections (substantial write data sections 1, 2, . . . , s (where s is a natural number)). The inner coding circuit 264 generates inner coding parities 1, 2, . . . , s for the substantial write data sections 1, 2, . . . , s, respectively. The substantial write data sections 1, 2, . . . , s are followed by the inner coding parities 1, 2, . . . , s, thereby forming the inner-coded data 1, 2 . . . , s.

An outer coding parity is generated for the concatenated inner-coded data 1, 2, . . . , s. The outer-coded data is written into the memory device 1 as write data.

Figure 37:
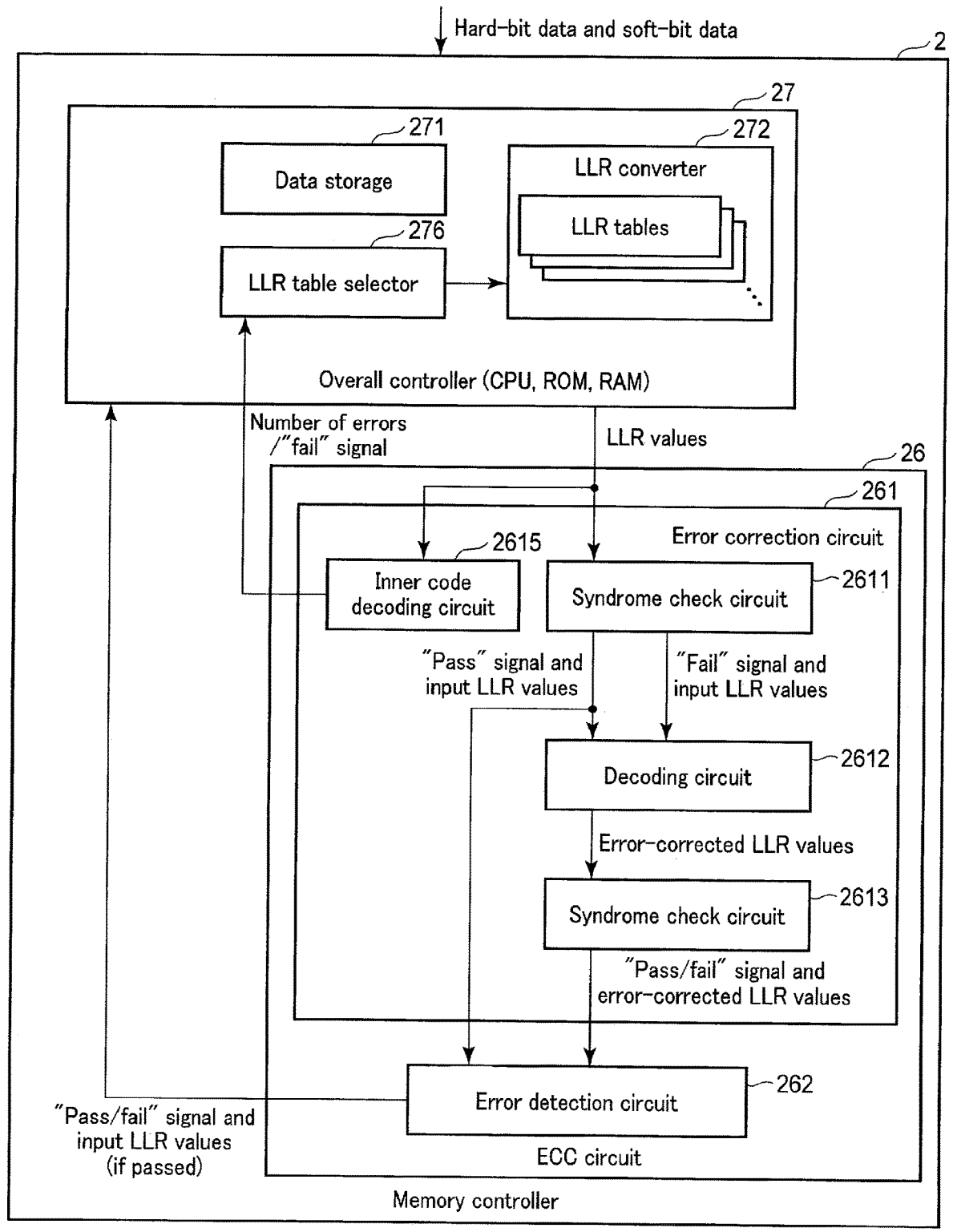
FIG. 37 is a functional block diagram showing components and connections of an ECC circuit according to the sixth embodiment, and components of a memory controller that are related to the ECC circuit.

FIG. 37 shows components and connections of an ECC circuit according to the sixth embodiment, and functional blocks related to the ECC circuit in a memory controller. As illustrated in this drawing, the error correction circuit 261 includes an inner code decoding circuit 2615. The inner code decoding circuit 2615 receives sets of data and parity for this data, and detects errors in the data using this data and the parity. The inner code decoding circuit 2615 decodes the input data based on the same coding scheme as the one adopted by the inner coding circuit 264. In other words, by using the inner coding parity, the inner code decoding circuit 2615 detects errors in the data that is associated with this inner coding parity. In particular, when receiving an substantial write data section (e.g., substantial write data section 1) and the corresponding inner coding parity (e.g., inner coding parity 1) as illustrated in FIG. 36, the inner code decoding circuit 2615 detects the number of errors in this substantial write data section. The number of detectable errors depends on the coding scheme adopted by the inner coding circuit 264 and inner code decoding circuit 2615.

The inner code decoding circuit 2615 supplies the number of detected errors to the LLR table selector 276. Alternatively, if the number of errors included in the input write data section and parity exceeds the error detection capability of the inner code decoding circuit 2615, the inner code decoding circuit 2615 supplies a signal notifying the "fail" determination to the LLR table selector 276.

Figure 38:
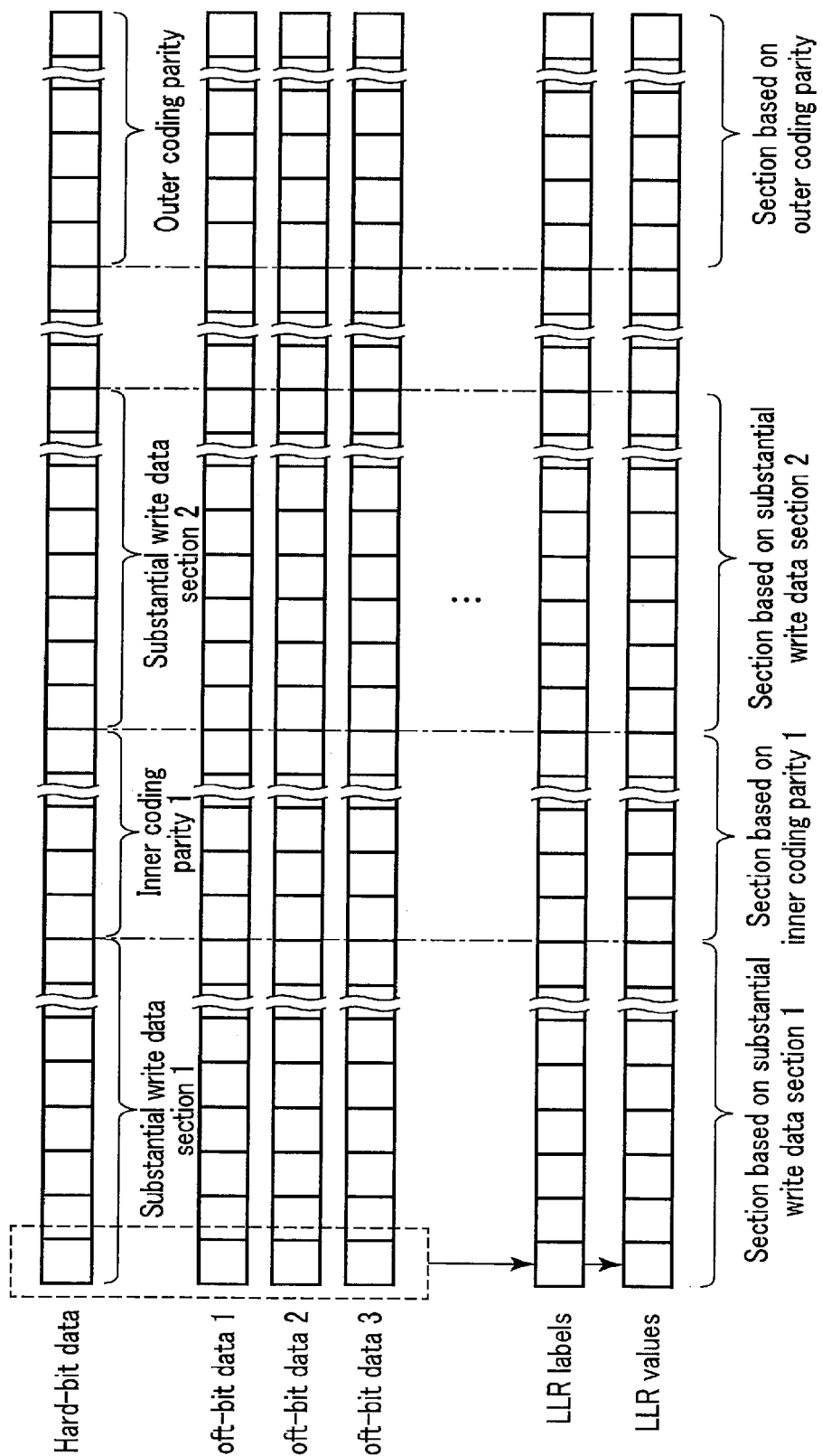
FIG. 38 shows details of hard-bit data, soft-bit data, LLR labels, and LLR values according to the sixth embodiment.

Next, the process flow according to the sixth embodiment will be described with reference to FIGS. 38 and 39. The entire processing flow according to the sixth embodiment is the same as the fourth embodiment (FIG. 28), but the sixth embodiment differs from the fourth embodiment in the sub-flow of Step S61.

According to the sixth embodiment, it is assumed that the outer-coded data shown in FIG. 36 is already written into the selected page. The hard-bit data and soft-bit data read at Steps S1 and S11 (FIG. 7) is therefore based on the outer-coded data of FIG. 38. In other words, the hard-bit data includes bits of the substantial write data sections, bits of the inner coding parities, and bits of the outer coding parity. The soft-bit data also includes bits of the substantial write data sections, bits of the inner coding parities, and bits of the outer coding parity. Thus, the LLR labels includes labels that are based on the bits of the substantial write data sections, labels that are based on the bits of the inner coding parities, and labels that are based on the bits of the outer coding parity.

Figure 39:
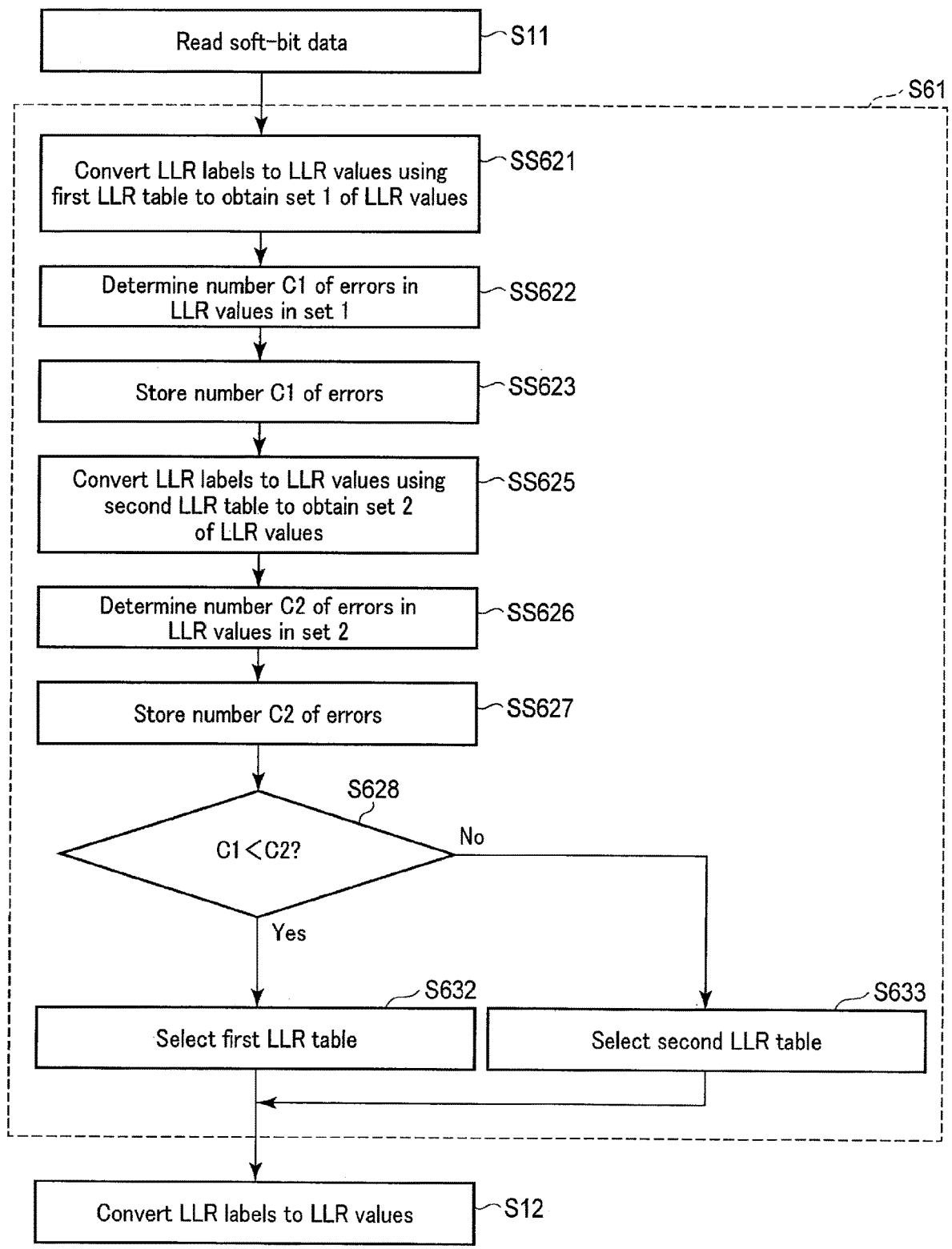
FIG. 39 shows a sub-flow of part of the operation of the memory system according to the sixth embodiment.

FIG. 39 describes the sub-flow of Step S61 according to the sixth embodiment. As indicated in this flowchart, Step S11 proceeds to Sub-step SS621. At Sub-step SS621, the overall controller 27 converts the LLR labels corresponding to the set of data (inner code check data) including any one of the substantial write data sections (e.g., substantial write data section 1) and its corresponding inner coding parity (e.g., inner coding parity 1) to a set of LLR values, based on the first LLR table (e.g., LLR table 2721$a$). The overall controller 27 supplies the acquired set of LLR values to the inner code decoding circuit 2615.

At Sub-step SS622, the inner code decoding circuit 2615 finds errors in the received set of LLR values and supply the number C1 of errors to the LLR table selector 276.

At Sub-step SS623, the LLR table selector 276 stores the number C1 of errors.

At Sub-step SS625, the overall controller 27 converts the LLR labels corresponding to the inner code check data to a set of LLR values, based on the second LLR table (e.g., LLR table 2721$b$). The overall controller 27 supplies the acquired set of LLR values to the inner code decoding circuit 2615.

At Sub-step SS626, the inner code decoding circuit 2615 finds errors in the received set of LLR values and supply the number C2 of errors to the LLR table selector 276.

At Sub-step SS627, the LLR table selector 276 stores the number C2 of errors.

At Sub-step SS628, the LLR table selector 276 compares the number C1 of errors with the number C2 of errors. If the number C1 is smaller than the number C2 (Yes at Sub-step SS628), the LLR table selector 276 selects the first LLR table (Sub-step SS632). If the number C1 is greater than or equal to the number C2 (No at Sub-step SS628), the LLR table selector 276 selects the second LLR table (Sub-step SS633). Sub-steps SS632 and SS633 proceed to Step S12.

For decoding at Step S12, either the LLR table selected at Sub-step SS632 or the LLR table selected at Sub-step SS633 is adopted.

By the comparison of three LLR tables or more with each other, one LLR table can be selected based on the result of the comparison. To achieve this, the operations of acquiring a set of LLR values, finding the number of errors, and storing this number (e.g., at Steps SS621, SS622, and SS623) are repeated for each of candidate LLR tables. Thereafter, the smallest one of the acquired numbers of errors is selected, and the LLR table that leads to the smallest number of errors is selected.

The memory controller 2 according to the sixth embodiment evaluates the LLR table that has been used, based on the result of the error correction using the inner coding parities. For this reason, before obtaining the result of decoding executed on the LLR values based on an LLR table, the LLR table that has been used may be evaluated, or in other words, may be compared with another LLR table. As a result, the re-selection of an LLR table can be performed in a shorter period of time than the re-selection of an LLR table based on the result of decoding. With such a method, the successful decoding can be achieved in a shorter length of time than the re-selection of an LLR table based on the result of the decoding.

While certain embodiments have been described, these embodiments have been presented by way of example only, and are not intended to limit the scope of the inventions. Indeed, the novel embodiments described herein may be embodied in various other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of controlling a memory device including a memory cell, the method comprising:
reading first data from the memory device based on a first data reading;
reading second data from the memory device based on a second data reading, the second data reading being different from the first data reading;
converting a first value that is based on the read first data and the read second data, to a second value in accordance with a first relationship; and
converting the first value to a third value in accordance with a second relationship, the second relationship being different from the first relationship.

2. The method according to claim 1, further comprising:
performing error correction to the second value; and
performing error correction to the third value when the error correction to the second value fails, wherein
the first value is converted to the third value when the error correction to the second value fails.

3. The method according to claim 1, further comprising decoding the first data, wherein
the second data is read when the decoding of the first data fails.

4. The method according to claim 1, wherein:
the first data reading uses a first voltage;
the second data reading uses a second voltage; and
the second voltage is different from the first voltage.

5. The method according to claim 1, wherein:
the first relationship is to convert the first value to the second value; and
the second relationship is to convert the first value to the third value, and is acquired by incrementing the second value.

6. The method according to claim 5, wherein:
the first relationship is to convert first to $n^{th}$ label values to first to $n^{th}$ conversion values, wherein n is a natural number;
the second relationship is to covert the first to $n^{th}$ label values to first to $n^{th}$ changed conversion values; and
the first to $n^{th}$ changed conversion values differ from the first to $n^{th}$ conversion values, respectively, by a first difference.

7. The method according to claim 1, wherein:
the first relationship is to convert the first value to the second value and to convert a fourth value to the third value; and
the second relationship is to convert the first value to the third value.

8. The method according to claim 7, wherein:
the first relationship is to convert first to $n^{th}$ label values to first to $n^{th}$ conversion values, respectively, wherein n is a natural number; and
the second relationship is to convert an $X^{th}$ label value to an $(X+p)^{th}$ label value, wherein X is a natural number smaller than or equal to n, and p is an integer other than 0.

9. The method according to claim 1, wherein:
the first relationship is to convert first to $n^{th}$ label values to first to $n^{th}$ conversion values, wherein n is a natural number;
the second relationship is to convert the first to $n^{th}$ label values to first to $n^{th}$ changed conversion values, respectively;
$X^{th}$ to $(X+p)^{th}$ changed conversion values differ from $X^{th}$ to $(X+p)^{th}$ conversion values, respectively, by a first difference, wherein X is a natural number smaller than or equal to n, and p is a natural number smaller than or equal to n–X; and
for each of cases of Y being number of 1 to n, a $Y^{th}$ label value is larger than a $(Y-1)^{th}$ label value by 1, wherein Y is a natural number smaller than or equal to n.

10. The method according to claim 9, further comprising:
converting the first value to a fourth value in accordance with a third relationship that is different from the first relationship and the second relationship;
performing error correction to the third value when the error correction to the second value fails; and
performing error correction to the fourth value when the error correction to the third value fails, wherein
the first relationship is to convert the first to $n^{th}$ label values to first to $n^{th}$ conversion values, respectively;
the second relationship is to convert a $Z^{th}$ label value to a $Z^{th}$ changed conversion value that is different from a $Z^{th}$ conversion value, wherein Z is a natural number smaller than or equal to n; and
the third relationship is to convert a $W^{th}$ label value to a $W^{th}$ changed conversion value that is different from a $W^{th}$ conversion value, wherein W is a natural number smaller than or equal to n, and W≠Z.

11. The method according to claim 1, further comprising reading data from the memory device based on a third data reading after error correction to the third value is successful, wherein:
the first data reading uses a first voltage;
the third data reading uses a second voltage that is different from the first voltage; and
the second voltage is determined based on the third value.

12. The method according to claim 1, further comprising calculating a first syndrome value based on the second value and a second syndrome value based on the third value, using the second value, the third value, and a first matrix.

13. The method according to claim 12, further comprising:
   selecting either one of the second value and the third value based on the first syndrome value and the second syndrome value; and
   performing error correction to the selected one of the second value and the third value, using the selected value and the first matrix.

14. The method according to claim 13, further comprising performing error correction to the second value by using the second value and the first matrix, when the first syndrome value is smaller than the second syndrome value.

15. The method according to claim 14, further comprising performing error correction to the third value by using the third value and the first matrix, when the second syndrome value is smaller than the first syndrome value.

16. The method according to claim 13, wherein:
   the first matrix includes a first submatrix and second submatrix, and
   the first syndrome value is calculated based on the second value and the first submatrix, and the second syndrome value is calculated based on the third value and the second submatrix.

17. A method of controlling a memory device including a first memory cell and a second memory cell, the method comprising:
   reading first data and second data from the first and second memory cells, respectively, in a first data reading;
   reading third data and fourth data from the first and second memory cells, respectively, in a second data reading that is different from the first data reading;
   acquiring a first value and a second value using the first to fourth data and a first relationship;
   detecting an error in the first value and the second value to acquire a first detection result;
   acquiring a third value and a fourth value using the first to fourth data and a second relationship that is different from the first relationship;
   detecting an error in the third value and the fourth value to acquire a second detection result; and
   correcting an error in the first data and the second data based on a result of comparing the first detection result and the second detection result.

18. The method according to claim 17, wherein:
   the first detection result represents the number of errors in the first value and the second value,
   the second detection result represents the number of errors in the third value and the fourth value, and
   the correcting of the error includes performing error correction, using the first relationship, to the first data and the second data when the first detection result is smaller than the second detection result.

19. The method according to claim 18, wherein:
   the correcting of the error includes performing the error correction, using the second relationship, to the first data and the second data when the second detection result is smaller than the first detection result.

20. The method according to claim 17, further comprising:
   generating a parity of the first data;
   storing at least a part of the first data in the first memory cell; and
   storing at least a part of the generated parity in the second memory cell.

* * * * *